United States Patent
Urano

(10) Patent No.: US 8,970,089 B2
(45) Date of Patent: Mar. 3, 2015

(54) DRIVE DEVICE, ELECTRONIC COMPONENT TRANSPORTING APPARATUS, ELECTRONIC COMPONENT INSPECTING APPARATUS, ROBOT HAND, AND ROBOT

(71) Applicant: Seiko Epson Corporation, Tokyo (JP)

(72) Inventor: Osamu Urano, Okaya (JP)

(73) Assignee: Seiko Epson Corporation (JP)

(*) Notice: Subject to any disclaimer, the term of this patent is extended or adjusted under 35 U.S.C. 154(b) by 6 days.

(21) Appl. No.: 13/693,357

(22) Filed: Dec. 4, 2012

(65) Prior Publication Data
US 2013/0140949 A1 Jun. 6, 2013

(30) Foreign Application Priority Data
Dec. 6, 2011 (JP) ................................ 2011-266542

(51) Int. Cl.
*H02N 2/06* (2006.01)
*H02N 2/14* (2006.01)
*H01L 41/04* (2006.01)
*B25J 15/08* (2006.01)
*H02N 2/00* (2006.01)

(52) U.S. Cl.
CPC .............. *H01L 41/042* (2013.01); *B25J 15/08* (2013.01); *H02N 2/0075* (2013.01); *H02N 2/0095* (2013.01); *Y10S 901/32* (2013.01)
USPC .................. 310/317; 310/323.01; 901/32

(58) Field of Classification Search
USPC ................... 310/317, 323.01–323.21, 328
See application file for complete search history.

(56) References Cited

U.S. PATENT DOCUMENTS

| | | | | |
|---|---|---|---|---|
| 5,786,654 A * | 7/1998 | Yoshida et al. | ................ | 310/328 |
| 6,147,434 A * | 11/2000 | Nakano et al. | ................ | 310/317 |
| 7,271,521 B2 | 9/2007 | Lixl et al. | | |
| 7,514,850 B2 * | 4/2009 | Asai | ................ | 310/328 |
| 7,777,969 B2 | 8/2010 | Shirono et al. | | |
| 2008/0252171 A1 * | 10/2008 | Kirigaya et al. | .......... | 310/313 D |

FOREIGN PATENT DOCUMENTS

| | | |
|---|---|---|
| JP | 06-186485 | 7/1994 |
| JP | 09-308271 | 11/1997 |
| JP | 2001-136760 | 5/2001 |
| JP | 2004-056951 | 2/2004 |
| JP | 2006-503532 | 1/2006 |
| JP | 2006-098595 | 4/2006 |

* cited by examiner

*Primary Examiner* — Derek Rosenau
(74) *Attorney, Agent, or Firm* — Harness, Dickey & Pierce, P.L.C.

(57) ABSTRACT

A drive device includes a movable member, plural piezoelectric motors that cause the movable member to move in a predetermined direction, a drive circuit that drives the plural piezoelectric motors, and plural relays that electrically connect or disconnect at least one of the plural piezoelectric motors to or from the drive circuit.

11 Claims, 15 Drawing Sheets

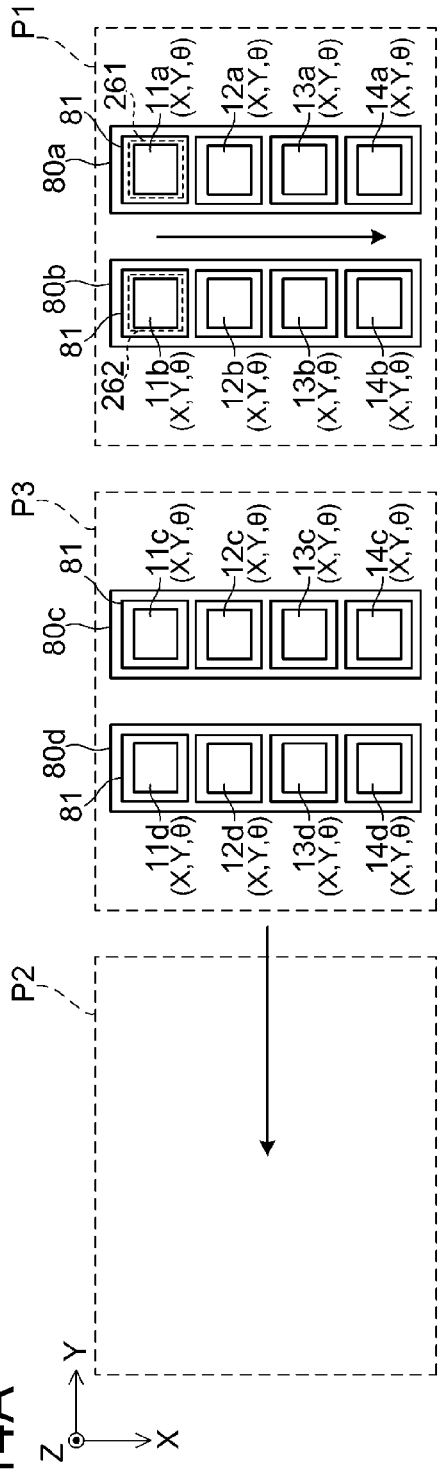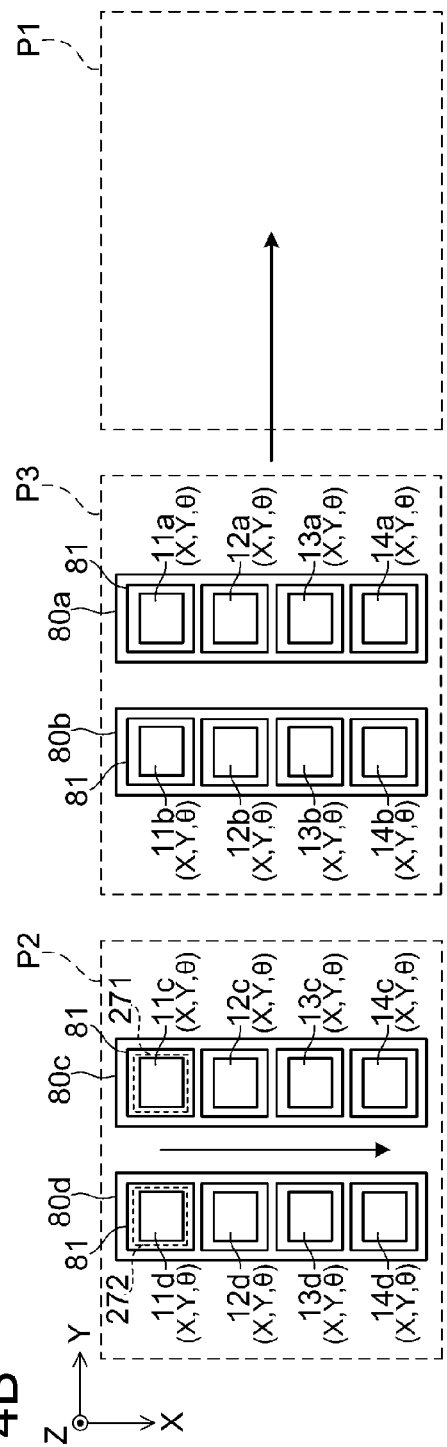
FIG. 14A
FIG. 14B

DRIVE DEVICE, ELECTRONIC COMPONENT TRANSPORTING APPARATUS, ELECTRONIC COMPONENT INSPECTING APPARATUS, ROBOT HAND, AND ROBOT

BACKGROUND

1. Technical Field

The present invention relates to a drive device, an electronic component transporting apparatus, an electronic component inspecting apparatus, a robot hand, and a robot.

2. Related Art

A drive device was known which causes a movable member to move by driving plural motors through the use of individual drive circuits. Such a drive device was used as, for example, a positioning device and could position the movable member at a predetermined position by sequentially driving the plural motors causing the movable member to move in different directions through the use of the drive circuits. The positioning device generally employed an electromagnetic motor or a pulse motor, and a brake mechanism holding a rotor in a non-driven state so as not to rotate was required for each motor.

On the contrary, a drive device using a piezoelectric motor (piezoelectric actuator) was proposed (for example, see JP-A-2001-136760). Since the piezoelectric motor transmitted vibration generated in a piezoelectric element as a frictional force to a rotating member and the position of the rotating member was held with the frictional force in a non-driven state, the piezoelectric motor did not require a brake mechanism. Therefore, as described in JP-A-2001-136760, with the drive device employing the piezoelectric motor, it was possible to achieve a decrease in size and weight of the drive device, compared with the drive device employing an electromagnetic motor or a pulse motor.

However, in the drive device described in JP-A-2001-136760, since the piezoelectric motors were driven with individual drive circuits, respectively, the drive circuits and the lines connecting the piezoelectric motors to the drive circuits were required to correspond to the number of piezoelectric motors. Accordingly, it was difficult to achieve a further decrease in size, weight, and cost of the drive device. Since the piezoelectric motors were disposed in the movable member supporting components or the like and moving, but the drive circuits were disposed at positions separated from the movable member, the weight of the lines or the restraining force due to a bundle of lines served as a larger load for causing the movable member to move with an increase in the number of lines connecting the piezoelectric motors and the drive circuits and it was difficult to accurately position the movable member.

SUMMARY

An advantage of some aspects of the invention is to solve at least a part of the problems described above and the invention can be implemented as the following forms or application examples.

Application Example 1

This application example is directed to a drive device including: a movable member; plural piezoelectric motors that cause the movable member to move in a predetermined direction; a drive circuit that drives the plural piezoelectric motors; and plural switching elements that electrically connect or disconnect at least one of the plural piezoelectric motors to or from the drive circuit.

According to this configuration, the plural switching elements electrically connect or disconnect at least one of the plural piezoelectric motors to or from the drive circuit. Accordingly, by switching the piezoelectric motor electrically connected to the drive circuit through the use of the switching elements and selectively driving the piezoelectric motors, it is possible to drive the plural piezoelectric motors in a time-divisional manner through the use of a common drive circuit and thus to cause the movable member to move. Therefore, it is possible to reduce the number of drive circuits and the number of lines connecting the piezoelectric motors to the drive circuits in comparison with the number of piezoelectric motors. Since the number of lines is reduced, it is possible to reduce the weight of the lines or the load to the movable member due to the bundle of lines. By employing the piezoelectric motors, it is possible to make a brake mechanism disposed for each motor unnecessary, compared with the case where an electromagnetic motor or a pulse motor is used. As a result, it is possible to achieve a decrease in size, weight, and cost of the drive device.

Application Example 2

In the drive device according to the above-mentioned application example, it is preferable that the plural piezoelectric motors includes piezoelectric motors that cause the movable member to move in different directions.

According to this configuration, since the piezoelectric motors causing the movable member to move in different directions are switched and driven individually, it is possible to cause the movable member to move easily and accurately to a desired position.

Application Example 3

In the drive device according to the above-mentioned application example, it is preferable that the plural switching elements are disposed for the plural piezoelectric motors, respectively.

According to this configuration, since the switching element is disposed for each piezoelectric motor, it is possible to individually drive the plural piezoelectric motors through the use of the single drive circuit.

Application Example 4

In the drive device according to the above-mentioned application example, it is preferable that each of the plural switching elements is formed of a photo-MOS relay.

According to this configuration, since each switching element is formed of a photo-MOS relay, it is possible to reduce the operating time for connection or disconnection and the power consumption and to extend the life time, compared with the case where each switching element is formed of a mechanical relay (electromagnetic relay). As a result, it is possible to provide a drive device with high performance and high reliability.

Application Example 5

This application example is directed to an electronic component transporting apparatus that causes an electronic component to move to a predetermined position, including: a movable member that supports the electronic component and that is movable; plural piezoelectric motors that cause the movable member to move in a predetermined direction; a drive circuit that drives the plural piezoelectric motors; and plural switching elements that are disposed between the plural piezoelectric motors and the drive circuit and that electrically connect or disconnect at least one of the plural piezoelectric motors to or from the drive circuit.

According to this configuration, the plural switching elements disposed between the plural piezoelectric motors and the drive circuit electrically connect or disconnect at least one of the plural piezoelectric motors to or from the drive circuit. Accordingly, by switching the piezoelectric motor electrically connected to the drive circuit through the use of the switching elements and selectively driving the piezoelectric motors, it is possible to drive the plural piezoelectric motors in a time-divisional manner through the use of the common drive circuit and thus to cause the movable member to move. Therefore, it is possible to reduce the number of drive circuits and the number of lines connecting the piezoelectric motors to the drive circuits. Since the number of lines is reduced, it is possible to reduce the weight of the lines or the load to the movable member due to the bundle of lines. By employing the piezoelectric motors, it is possible to make a brake mechanism disposed for each motor unnecessary, compared with the case where an electromagnetic motor or a pulse motor is used. As a result, it is possible to achieve a decrease in size, weight, and cost of the electronic component transporting apparatus.

Application Example 6

It is preferable that the electronic component transporting apparatus according to the above-mentioned application example further includes a linearly-moving mechanism that causes the movable member to move forward and backward in a first direction, the plural piezoelectric motors includes a first piezoelectric motor that causes the movable member to move in the first direction and a second piezoelectric motor that causes the movable member to move in a second direction different from the first direction, and the first piezoelectric motor is disposed to be closer to the movable member than the second piezoelectric motor with respect to the linearly-moving mechanism.

According to this configuration, the first piezoelectric motor that causes the movable member to move in the first direction in which the movable member moves forward and backward by the linearly-moving mechanism is disposed closer to the movable member than the second piezoelectric motor that causes the movable member to move in the second direction. When the movable member moves forward and backward in the first direction through the linearly-moving mechanism in a state where the piezoelectric motors is in a non-driven state, the first piezoelectric motor having the same moving direction has a higher possibility of moving and being shifted with the inertial force of the forward and backward movement than the second piezoelectric motor having a different moving direction. When the movable member is located vertically below the linearly-moving mechanism and the second piezoelectric motor is disposed to be closer to the movable member than, that is, vertically below, the first piezoelectric motor, the gravitational force of the second piezoelectric motor is applied to the first piezoelectric motor and thus the inertial force acting on the first piezoelectric motor increases. On the contrary, by locating the first piezoelectric motor vertically below the second piezoelectric motor, it is possible to reduce the inertial force acting on the first piezoelectric motor by the gravitational force of the second piezoelectric motor. As a result, it is possible to suppress the moving and shifting of the first piezoelectric motor.

Application Example 7

This application example is directed to an electronic component inspecting apparatus that causes an electronic component to move to a predetermined position and to be disposed at the predetermined position and that electrically inspects the electronic component, including: an inspection unit that inspects the electronic component; a movable member that supports the electronic component and that is movable; plural piezoelectric motors that cause the movable member to move in a predetermined direction; a drive circuit that drives the plural piezoelectric motors; and plural switching elements that are disposed between the plural piezoelectric motors and the drive circuit and that electrically connect or disconnect at least one of the plural piezoelectric motors to or from the drive circuit.

According to this configuration, the plural switching elements disposed between the plural piezoelectric motors and the drive circuit electrically connect or disconnect at least one of the plural piezoelectric motors to or from the drive circuit. Accordingly, by switching the piezoelectric motor electrically connected to the drive circuit through the use of the switching elements and selectively driving the piezoelectric motors, it is possible to drive the plural piezoelectric motors in a time-divisional manner through the use of the common drive circuit and thus to cause the movable member to move. Therefore, it is possible to reduce the number of drive circuits and the number of lines connecting the piezoelectric motors to the drive circuits in comparison with the number of piezoelectric motors. Since the number of lines is reduced, it is possible to reduce the weight of the lines or the load to the movable member due to the bundle of lines. By employing the piezoelectric motors, it is possible to make a brake mechanism disposed for each motor unnecessary, compared with the case where an electromagnetic motor or a pulse motor is used. As a result, it is possible to achieve a decrease in size, weight, and cost of the electronic component inspecting apparatus.

Application Example 8

It is preferable that the electronic component inspecting apparatus according to the above-mentioned application example further includes a linearly-moving mechanism that causes the movable member to move forward and backward in a first direction, the plural piezoelectric motors include a first piezoelectric motor that causes the movable member to move in the first direction and a second piezoelectric motor that causes the movable member to move in a second direction different from the first direction, and the first piezoelectric motor is disposed to be closer to the movable member than the second piezoelectric motor with respect to the linearly-moving mechanism.

According to this configuration, the first piezoelectric motor that causes the movable member to move in the first direction in which the movable member moves forward and backward by the linearly-moving mechanism is disposed closer to the movable member than the second piezoelectric motor that causes the movable member to move in the second direction. When the movable member moves forward and backward in the first direction through the linearly-moving mechanism in a state where the piezoelectric motors is in a non-driven state, the first piezoelectric motor having the same moving direction has a higher possibility of moving and being shifted with the inertial force of the forward and backward movement than the second piezoelectric motor having a different moving direction. When the movable member is located vertically below the linearly-moving mechanism and the second piezoelectric motor is disposed to be closer to the movable member than, that is, vertically below, the first piezoelectric motor, the gravitational force of the second piezoelectric motor is applied to the first piezoelectric motor and thus the inertial force acting on the first piezoelectric motor increases. On the contrary, by locating the first piezoelectric motor vertically below the second piezoelectric motor, it is possible to reduce the inertial force acting on the first piezoelectric motor by the gravitational force of the second piezoelectric motor. As a result, it is possible to suppress the moving and shifting of the first piezoelectric motor.

Application Example 9

This application example is directed to a robot hand including: a movable member; plural piezoelectric motors that cause the movable member to move in a predetermined direction; a drive circuit that drives the plural piezoelectric motors; and plural switching elements that are disposed between the plural piezoelectric motors and the drive circuit and that electrically connect or disconnect at least one of the plural piezoelectric motors to or from the drive circuit.

According to this configuration, the plural switching elements disposed between the plural piezoelectric motors and the drive circuit electrically connect or disconnect at least one of the plural piezoelectric motors to or from the drive circuit. Accordingly, by switching the piezoelectric motor electrically connected to the drive circuit through the use of the switching elements and selectively driving the piezoelectric motors, it is possible to drive the plural piezoelectric motors in a time-divisional manner through the use of the common drive circuit and thus to cause the movable member to move. Therefore, it is possible to reduce the number of drive circuits and the number of lines connecting the piezoelectric motors to the drive circuits in comparison with the number of piezoelectric motors. Since the number of lines is reduced, it is possible to reduce the weight of the lines or the load to the movable member due to the bundle of lines. By employing the piezoelectric motors, it is possible to make a brake mechanism disposed for each motor unnecessary, compared with the case where an electromagnetic motor or a pulse motor is used. As a result, it is possible to achieve a decrease in size, weight, and cost of the robot hand.

Application Example 10

This application example is directed to a robot including: a movable member; plural piezoelectric motors that cause the movable member to move in a predetermined direction; a drive circuit that drives the plural piezoelectric motors; and plural switching elements that are disposed between the plural piezoelectric motors and the drive circuit and that electrically connect or disconnect at least one of the plural piezoelectric motors to or from the drive circuit.

According to this configuration, the plural switching elements disposed between the plural piezoelectric motors and the drive circuit electrically connect or disconnect at least one of the plural piezoelectric motors to or from the drive circuit. Accordingly, by switching the piezoelectric motor electrically connected to the drive circuit through the use of the switching elements and selectively driving the piezoelectric motors, it is possible to drive the plural piezoelectric motors in a time-divisional manner through the use of the common drive circuit and thus to cause the movable member to move. Therefore, it is possible to reduce the number of drive circuits and the number of lines connecting the piezoelectric motors to the drive circuits in comparison with the number of piezoelectric motors. Since the number of lines is reduced, it is possible to reduce the weight of the lines or the load to the movable member due to the bundle of lines. By employing the piezoelectric motors, it is possible to make a brake mechanism disposed for each motor unnecessary, compared with the case where an electromagnetic motor or a pulse motor is used. As a result, it is possible to achieve a decrease in size, weight, and cost of the robot.

BRIEF DESCRIPTION OF THE DRAWINGS

The invention will be described with reference to the accompanying drawings, wherein like numbers reference like elements.

FIGS. 14A and 14B are diagrams illustrating a drive control method of the positioning mechanism of the electronic component inspecting apparatus according to the third embodiment.

DESCRIPTION OF EXEMPLARY EMBODIMENTS

Figure 1:
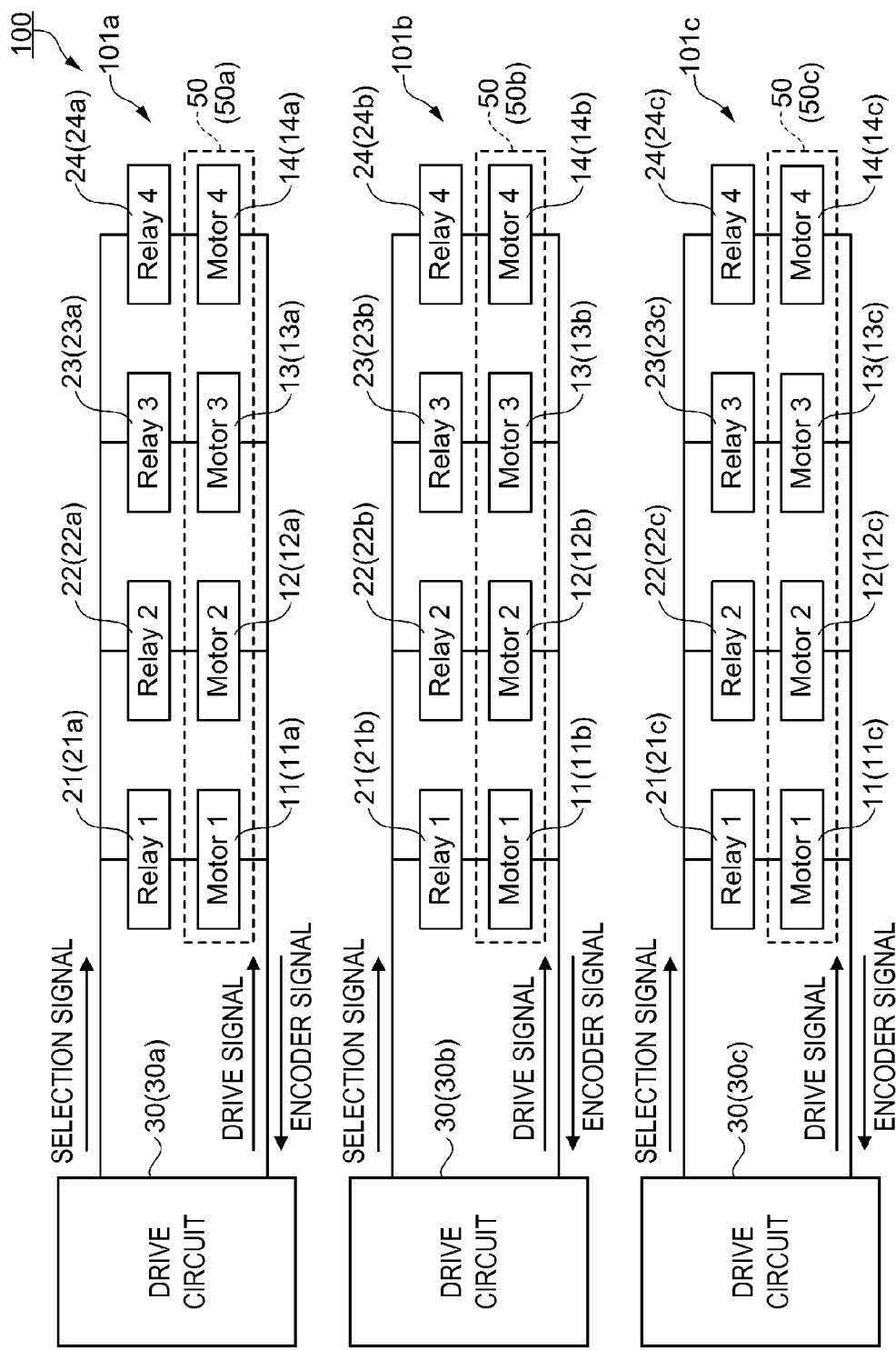
FIG. 1 is a block diagram schematically illustrating the configuration of a drive device according to a first embodiment of the invention.

Hereinafter, exemplary embodiments of the invention will be described with reference to the accompanying drawings.

In the drawings which are mentioned in the following description, size ratios, angles, and the like of elements may be different, for the purpose of easily understanding the configuration.

First Embodiment

Drive Device

First, the configuration of a first embodiment of the invention will be described below. FIG. 1 is a block diagram schematically illustrating the configuration of a drive device according to the first embodiment. As shown in FIG. 1, the drive device 100 according to the first embodiment includes three drive units 101a, 101b, and 101c.

The drive units 101a, 101b, and 101c have the same configuration. The drive units 101 and movable members 50, drive circuits 30, relays 21, 22, 23, and 24 as the switching elements, and piezoelectric motors 11, 12, 13, and 14 of each drive unit are distinguished by a, b, and c added to reference numerals.

That is, the drive device 100 includes movable members 50a, 50b, and 50c, drive circuits 30a, 30b, and 30c, piezoelectric motors 11a, 11b, 11c, 12a, 12b, 12c, 13a, 13b, 13c, 14a, 14b, and 14c, and relays 21a, 21b, 21c, 22a, 22b, 22c, 23a, 23b, 23c, 24a, 24b, and 24c. Hereinafter, a, b, and c added to the reference numerals will not be repeated.

In each drive unit 101, four piezoelectric motors 11, 12, 13, and 14 are disposed for the movable member 50. The relays 21, 22, 23, and 24 are disposed for the piezoelectric motors 11, 12, 13, and 14, respectively. That is, the piezoelectric motors 11, 12, 13, and 14 are connected to the relays 21, 22, 23, and 24, respectively, in a one-to-one manner and are connected to the drive circuit 30 driving the piezoelectric motors 11, 12, 13, and 14 via the relays 21, 22, 23, and 24, respectively.

Each of the relays 21, 22, 23, and 24 is formed of, for example, a photo-MOS relay. The relays 21, 22, 23, and 24 operate on the basis of a selection signal output from the drive circuit 30 and electrically connect or disconnect the piezoelectric motors 11, 12, 13, and 14 to or from the drive circuit 30. By switching the relays 21, 22, 23, and 24, a drive signal from the drive circuit 30 is selectively supplied to the piezoelectric motor electrically connected to the drive circuit 30 out of the piezoelectric motors 11, 12, 13, and 14. An encoder signal is fed back to the drive circuit 30 through the operation of the piezoelectric motor supplied with the drive signal from the drive circuit 30 out of the piezoelectric motors 11, 12, 13, and 14.

The drive device 100 is a 12-axis drive device causing three movable members 50 to desired positions by selectively connecting one of four (four-axis) piezoelectric motors 11, 12, 13, and 14 to the drive circuit 30 through the switching of the relays 21, 22, 23, and 24 of each of the three drive units 101a, 101b, and 101c and time-divisionally driving the connected piezoelectric motor. The drive control method of the drive device 100 will be described later.

In this embodiment, each of the relays 21, 22, 23, and 24 is formed of a photo-MOS relay, but may be formed of a mechanical relay (electromagnetic relay). However, since the photo-MOS relay has a shorter operation (response) time of connection and disconnection than the mechanical delay, the switching operation can be performed rapidly, the power consumption thereof is small, and the lifetime is long. Therefore, the photo-MOS relay is preferably used for the relays 21, 22, 23, and 24.

Piezoelectric Motor

Figure 2:
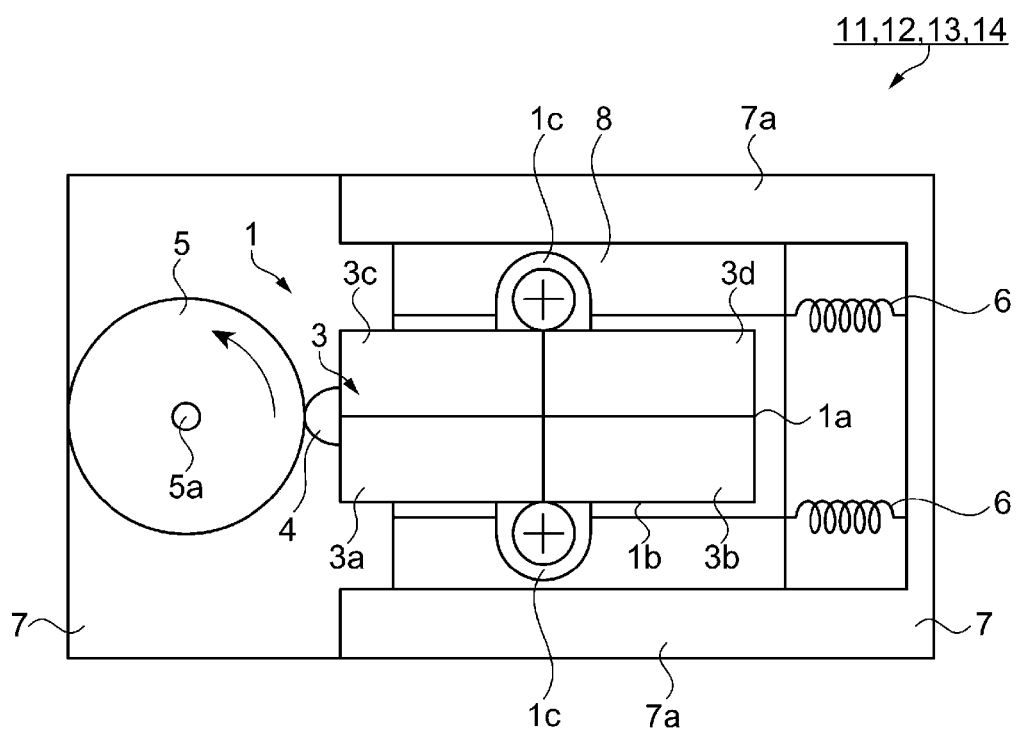
FIG. 2 is a diagram schematically illustrating the configuration of a piezoelectric motor used in the drive device according to the first embodiment.
Figure 3:
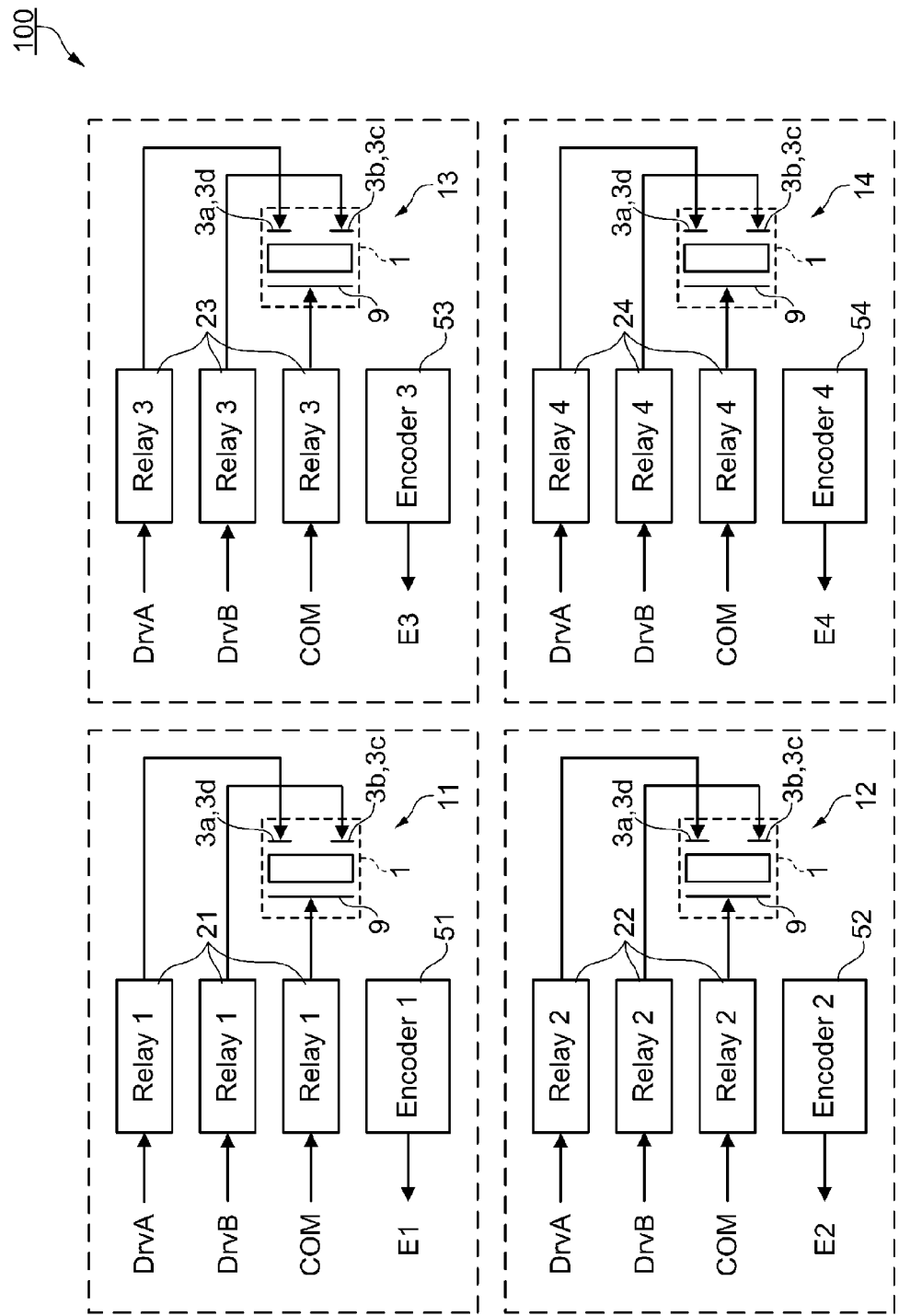
FIG. 3 is a block diagram illustrating the configuration of the drive device according to the first embodiment.

The configuration of the piezoelectric motors 11, 12, 13, and 14 will be described below. FIG. 2 is a diagram schematically illustrating the configuration of a piezoelectric motor used in the drive device according to the first embodiment. FIG. 3 is a block diagram illustrating the configuration of the drive device according to the first embodiment.

The piezoelectric motors 11, 12, 13, and 14 have the same configuration. As shown in FIG. 2, each of the piezoelectric motors 11, 12, 13, and 14 includes a vibration member 1, a driven object 5, a support member 8, an impelling spring 6, and a base 7. The vibration member 1, the driven object 5, the support member 8, and the impelling spring 6 are installed in the base 7. Here, an example where the driven object 5 is a rotor to be rotationally driven.

In the plan view shown in FIG. 2, the vibration member 1 has a substantially rectangular shape having a short side 1a and a long side 1b. In the following description, the direction along the short side 1a is referred to as a short direction and the direction along the long side 1b is referred to as a long direction. The vibration member 1 is formed of a piezoelectric element having a plate shape, but may be formed of a stacked member in which a piezoelectric element and a vibration plate are stacked.

The piezoelectric element is formed of a piezoelectric material having an electromechanical conversion function, and is formed of, for example, metal oxide having a perovskite structure expressed by General Formula $ABO_3$. Examples of such metal oxide include piezoelectric zirconate titanate ($Pb(Zr, Ti)O_3$: PZT), lithium niobate ($LiNbO_3$).

An electrode 3 formed of conductive metal such as Ni, Au, and Ag is disposed on the vibration member 1. The electrode 3 is substantially divided into four portions by grooves formed at the center in the short direction of the vibration member 1 and at the center in the long direction thereof. As a result, the electrode 3 is divided into four electrode portions of electrode portions 3a, 3b, 3c, and 3d individual electrodes electrically isolated from each other. A common electrode 9 (see FIG. 3) is disposed on the opposite surface of the vibration member 1.

Out of the four electrode portions of the electrode 3, the electrode portions 3a and 3d disposed to form a diagonal as a pair serve as a first bending-vibration electrode. The electrode portions 3c and 3b disposed to form a diagonal as a pair intersecting the electrode portions 3a and 3d serve as a second bending-vibration electrode. The region in which the electrode portions 3a and 3d are disposed and the region in which the electrode portions 3c and 3b are disposed are bending-vibration excitation regions in which bending vibration is excited in the short direction of the vibration member 1.

The vibration member 1 includes a sliding portion 4 that extends to protrude toward the driven object 5 and that comes in contact with the side surface (circumferential surface) of the driven object 5. The vibration member 1 includes a pair of arm portions 1c extending to both ends in the short direction. A through-hole penetrating the arm portion in the thickness direction thereof is formed in each arm portion 1c. The arm portions 1c are fixed to the support member 8 with screws inserted through the through-holes. As a result, the vibration member 1 is supported by the support member 8 in a state where the vibration member can vibrate in a bending vibration manner about the arm portions 1c.

The driven object 5 has a disk shape and is disposed on the side on which the sliding portion 4 of the vibration member 1 is disposed. The driven object 5 is supported to be rotatable about a rod-like shaft 5a standing upright on the base 7. In the piezoelectric motors 11, 12, 13, and 14, encoders 51, 52, 53, and 54 (see FIG. 3) are disposed at positions close to the driven objects 5. The encoders 51, 52, 53, and 54 feed back encoder signals E1, E2, E3, and E4 based on the position or the rotation speed of the driven objects 5 to the drive circuit 30.

The base 7 includes a pair of slide portions 7a extending along the long direction on both outsides in the short direction of the vibration member 1. The support member 8 is supported by the base 7 so as to slide along the slide portions 7a.

Impelling springs 6 are disposed between the side of the support member 8 opposite to the driven object 5 and the base 7. The impelling springs 6 impels the vibration member 1 to the driven object 5 via the support member 8, and the sliding portion 4 comes in contact with the driven object 5 with a predetermined force based on the impelling force. The impelling force of the impelling springs 6 is appropriately set to generate an appropriate frictional force between the driven object 5 and the sliding portion 4. As a result, the vibration of the vibration member 1 is efficiently transmitted to the driven object 5 via the sliding portion 4.

When a common signal (COM shown in FIG. 3) is supplied to the common electrode 9 from the drive circuit 30 (see FIG. 1) and a drive signal (DrvA shown in FIG. 3) is supplied to the electrode portions 3a and 3d as the first bending-vibration electrode, bending vibration in which the vibration member is bent in the short direction is excited in the vibration member 1. The sliding portion 4 slides to draw a clockwise elliptic orbit by this bending vibration. As a result, the driven object 5 rotates in a counterclockwise direction as indicated by an arrow in FIG. 2.

On the other hand, when the common signal (COM) is supplied to the common electrode 9 and a drive signal (DrvB shown in FIG. 3) is supplied to the electrode portions 3c and 3b as the second bending-vibration electrode, bending vibration in which the vibration member is bent in the short direction is excited in the vibration member 1. The sliding portion 4 slides to draw a counterclockwise elliptic orbit by this bending vibration. As a result, the driven object 5 rotates in a clockwise direction which is opposite to the direction indicated by an arrow in FIG. 2.

In this way, the piezoelectric motors 11, 12, 13, and 14 can cause the driven object 5 to rotate in both the counterclockwise direction and the clockwise direction, by switching the selection of the first bending-vibration electrode (the electrode portions 3a and 3d) and the selection of the second bending-vibration electrode (electrode portions 3c and 3b) when the drive signal is supplied to the common electrode 9 and the electrode portions 3a, 3b, 3c, and 3d from the drive circuit 30. As a result, the moving direction of the movable member 50 (see FIG. 1) can be switched to a forward direction and a backward direction.

The driven object 5 is not limited to the above-mentioned rotor to be rotationally driven. The driven object 5 may be a linearly-driven object to be linearly driven, and the driving direction of the driven object 5 can be determined arbitrarily. When the driven object 5 is a linearly-driven object, the linearly-moving direction of the driven object 5 can be switched to a forward direction and a backward direction, by switching the first bending-vibration electrode (the electrode portions 3a and 3d) and the second bending-vibration electrode (the electrode portions 3c and 3b).

As shown in FIG. 3, only the piezoelectric motor electrically connected to the drive circuit 30 via the relays 21, 22, 23, and 24 out of the piezoelectric motors 11, 12, 13, and 14 is supplied with the drive signal (DrvA or DrvB) of the bending-vibration electrode and the common signal (COM) and is driven. The piezoelectric motors electrically disconnected from the drive circuit 30 by the relays 21, 22, 23, and 24 are in a non-driven state.

In the non-driven state, the driven object 5 is held at the position at which the rotation is stopped by the frictional force acting on the sliding portion 4. Therefore, the piezoelectric motors 11, 12, 13, and 14 do not require a brake mechanism which was disposed for each motor so as to cause the rotor not to rotate in the non-driven state like an electromagnetic motor or a pulse motor. Accordingly, by using the piezoelectric motors 11, 12, 13, and 14, it is possible to achieve a decrease in size, weight, and cost of the drive device 100.

The piezoelectric motors 11, 12, 13, and 14 may further include an acceleration and deceleration mechanism accelerating or decelerating and transmitting the rotation of the driven object 5. When the acceleration and deceleration mechanism is provided, it is possible to easily achieve a desired rotation speed by accelerating or decelerating the rotation speed of the driven object 5.

Drive Circuit

Figure 4:
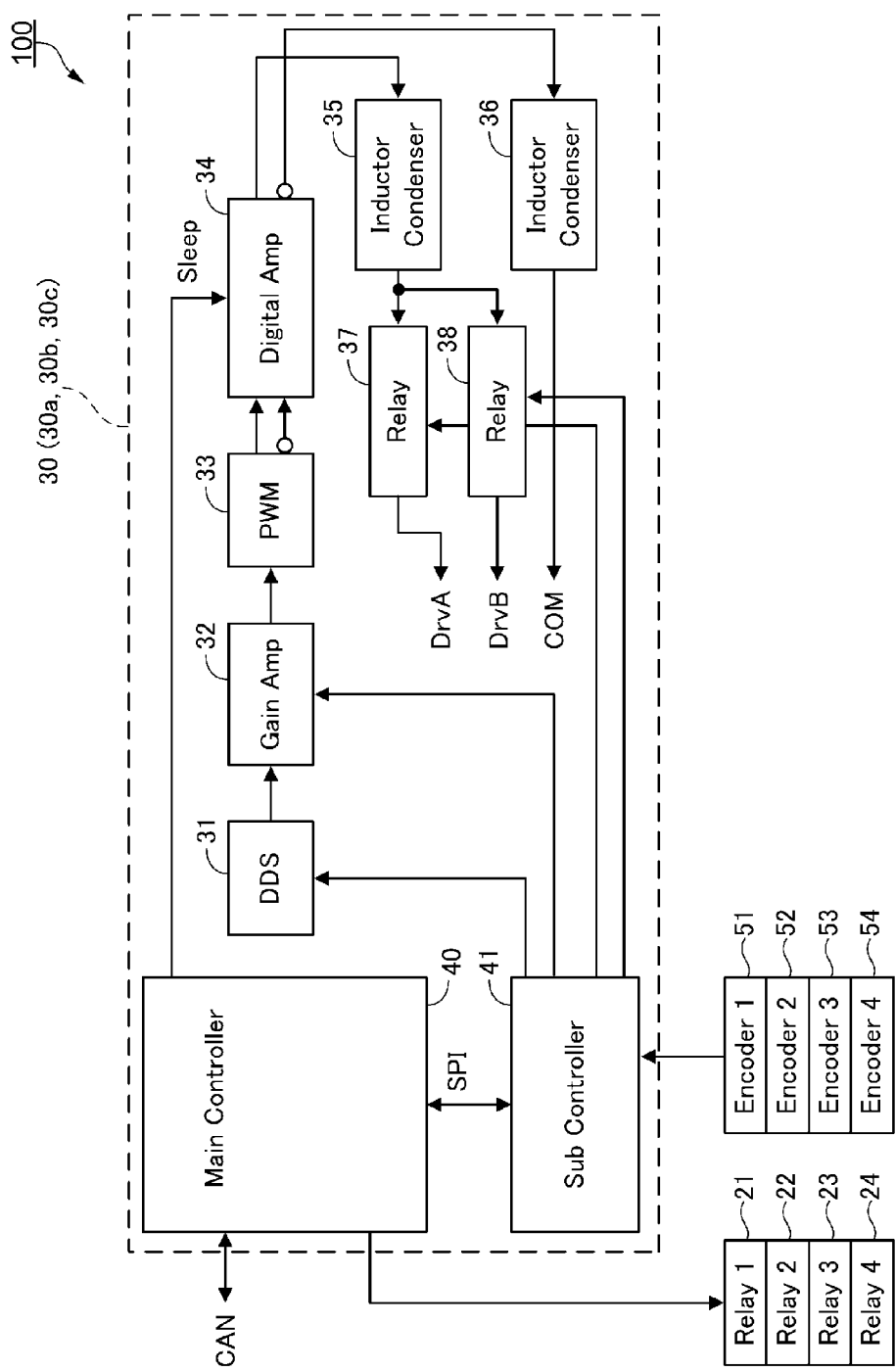
FIG. 4 is a block diagram illustrating the configuration of a drive circuit according to the first embodiment.

The schematic configuration of the drive circuit according to the first embodiment will be described below. FIG. 4 is a block diagram illustrating the configuration of the drive circuit according to the first embodiment. A shown in FIG. 4, each drive circuit 30 (30a, 30b, or 30c) includes a main controller 40, a sub controller 41, an oscillator 31, a gain amplifier 32, a PWM unit 33, a digital amplifier 34, inductor condensers 35 and 36, and relays 37 and 38.

The main controller 40 is constructed by a CPU (Central Processing Unit). The main controller 40 is connected to a control device (not shown) controlling the overall system including the drive device 100 via a CAN (Controller Area Network). The main controller 40 controls the operation of the drive device 100, such as switching the piezoelectric motors 11, 12, 13, and 14 through the use of the relays 21, 22, 23, and 24 on the basis of an instruction from the control device to drive the piezoelectric motors in time-division manner.

The sub controller 41 is constructed by a logic IC or an FPGA (Field Programmable Gate Array). The sub controller 41 is connected to the main controller 40 via an SPI (Serial Peripheral Interface). The sub controller 41 controls the frequency of the signal generated from the oscillator 31, the amplification rate of the gain amplifier 32, the switching of the relays 37 and 38, and the like on the basis of an instruction from the main controller 40. The sub controller 41 detects the position or the rotation speed of the driven objects 5 of the piezoelectric motors 11, 12, 13, and 14 on the basis of the encoder signals (E1, E2, E3, and E4 shown in FIG. 3) fed back from the encoders 51, 52, 53, and 54.

The oscillator 31 is constructed by a DDS (Direct Digital Synthesizer) or the like. The oscillator 31 generates a signal serving as a basis of the drive signals supplied to the vibration members 1 of the piezoelectric motors 11, 12, 13, and 14. The signal generated from the oscillator 31 is converted into an analog signal by a DA converter. The oscillator 31 adjusts the frequency of the drive signal on the basis of an instruction from the sub controller 41.

The gain amplifier 32 is constructed, for example, by a digital potentiometer and an operational amplifier. The gain amplifier 32 amplifies the analog signal from the oscillator 31 under digital control. The gain amplifier 32 adjusts the voltage difference of the drive signals on the basis of an instruction from the sub controller 41.

The PWM unit 33 is constructed by a PWM (Pulse Width Modulation) circuit. The PWM unit 33 performs equivalent analog control by changing the duty ratio of pulses of the signal input from the gain amplifier 32.

The digital amplifier 34 is constructed by an H-bridged circuit of MOS transistors, and serves as a digital amplifier along with the PWM unit 33. The digital amplifier 34 amplifies and switches power of the signal from the PWM unit 33. When an instruction of "sleep" is given from the main controller 40, the function of amplifying and switching the power is turned off.

The inductor condensers 35 and 36 shape the waveform of the drive signal output from the digital amplifier 34 to form a sinusoidal wave. The inductor condensers 35 and 36 also serve as a filter circuit, a matching circuit of the piezoelectric motors 11, 12, 13, and 14, a booster circuit, and the like.

The drive signal (DrvA) is output from the inductor condenser 35 to the first bending-vibration electrode (the electrode portions 3a and 3d shown in FIG. 2) of the piezoelectric motors 11, 12, 13, and 14 via the relay 37, and the drive signal (DrvB) is output to the second bending-vibration electrode (the electrode portions 3c and 3b shown in FIG. 2) via the relay 38. The common signal (COM) is output from the inductor condenser 36 to the common electrode 9 (see FIG. 3) of the piezoelectric motors 11, 12, 13, and 14.

The relays 37 and 38 are constructed by a photo-MOS relay. The relays 37 and 38 operate on the basis of an instruction from the sub controller 41, and switches a state where the first bending-vibration electrode (the electrode portions 3a and 3d), the second bending-vibration electrode (the electrode portions 3c and 3b), and the inductor condenser 35 are electrically connected and a state where they are electrically disconnected. By switching the relays 37 and 38 to select the first bending-vibration electrode (the electrode portions 3a and 3d) or the second bending-vibration electrode (the electrode portions 3c and 3b), the driven objects 5 of the piezoelectric motors 11, 12, 13, and 14 rotates counterclockwise or clockwise.

Drive Control Method

The drive control method of the drive device according to the first embodiment will be described below. FIGS. 5A to 5E are diagrams illustrating the drive control method of the drive device according to the first embodiment.

Figure 5A:
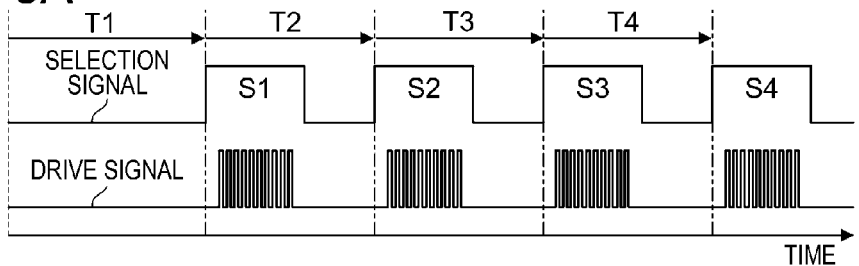
FIGS. 5A to 5E are diagrams illustrating a drive control method of the drive device according to the first embodiment.

First, as described with reference to FIG. 1, in each of the drive units 101a, 101b, and 101c, the a selection signal and a drive signal are output from the drive circuit 30 to the relays 21, 22, 23, and 24 and the piezoelectric motors 11, 12, 13, and 14. FIG. 5A schematically illustrates the forms of the selection signal and the drive signal output from the drive circuit 30 to the relays 21, 22, 23, and 24 and the piezoelectric motors 11, 12, 13, and 14.

As shown in FIG. 5A, the selection signal includes signals S1, S2, S3, and S4 sequentially appearing in a time-division manner. The signal S1 appears after time T1 passes from the reference time point such as a start of operation, and the signal S2 appears after time T2 passes from time T1. The signal S3 appears after time T3 passes from time T2, and the signal S4 appears after time T4 passes from time T3. The drive signal is output to be synchronized with the signals S1, S2, S3, and S4 and to correspond to the durations of the signals S1, S2, S3, and S4.

The signal S1 is a signal causing the relay 21 to be in the connected state, and the signals S2, S3, and S4 are signals individually causing the relays 22, 23, and 24 to be in the connected state, respectively. The relay designated by the selection signal (the signals S1, S2, S3, and S4) out of the relays 21, 22, 23, and 24 is in the connected state, and the other relays are in the disconnected state. Therefore, only the piezoelectric motor corresponding to the relay in the connected state on the basis of the selection signal out of the piezoelectric motors 11, 12, 13, and 14 is selectively electrically connected to the drive circuit 30.

Figure 5B:
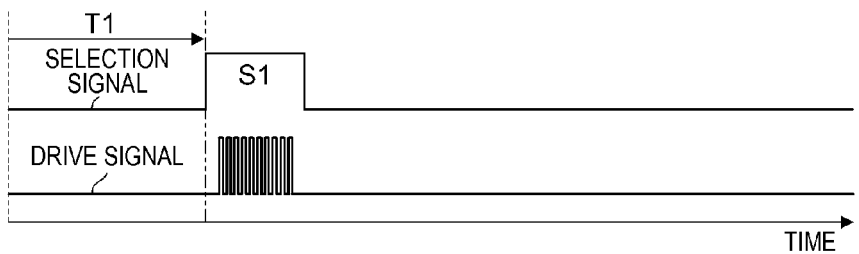
Figure 5C:
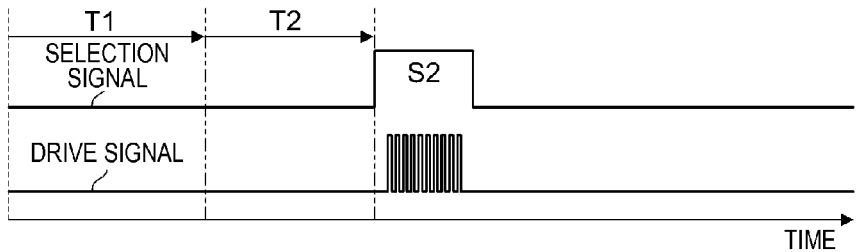

As shown in FIG. 5B, after time T1 passes, since the relay 21 designated by the selection signal (the signal S1) is in the connected state and only the piezoelectric motor 11 is electrically connected to the drive circuit 30, the drive signal is supplied to only the piezoelectric motor 11. As shown in FIG. 5C, after time T2 passes from time T1, since the relay 22 designated by the selection signal (the signal S2) is in the connected state and only the piezoelectric motor 12 is electrically connected to the drive circuit 30, the drive signal is supplied to only the piezoelectric motor 12.

Figure 5D:
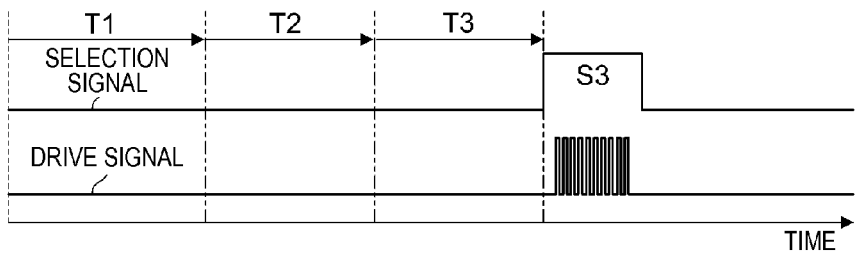
Figure 5E:
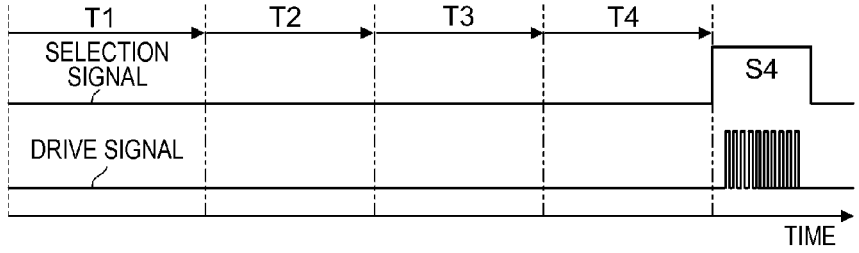

Similarly, after time T3 passes as shown in FIG. 5D, since the relay 23 is in the connected state and the drive signal is supplied to the piezoelectric motor 13. After time T4 passes as shown in FIG. 5E, the relay 24 is in the connected state and the drive signal is supplied to the piezoelectric motor 14. In this way, it is possible to sequentially drive four piezoelectric motors 11, 12, 13, and 14 in a time-division manner through the use of a single drive circuit 30. As a result, a line connected to the drive circuit 30 can be shared by the four piezoelectric motors 11, 12, 13, and 14.

In three drive units 101a, 101b, and 101c, the piezoelectric motors 11, 12, 13, and 14 can be synchronously driven by synchronously supplying the selection signal and the drive signal. That is, the movable members 50a, 50b, and 50c shown in FIG. 1 can be made to synchronously move.

Here, the directions in which the movable members 50 (50a, 50b, and 50c) shown in FIG. 1 are made to move by the fourth piezoelectric motors 11, 12, 13, and 14 may be equal to or different from each other. For example, when the moving directions by the piezoelectric motors 11, 12, 13, and 14 are defined as three directions of an X direction, a Y direction, and a Z direction perpendicular to each other and a direction rotating about the Z direction is defined as a θ direction, the movable members 50 can be made to sequentially move in the X direction, the Y direction, the Z direction, and the θ direction and can be located at a desired position, by sequentially driving the piezoelectric motors 11, 12, 13, and 14 through the switching of the relays 21, 22, 23, and 24.

Alternatively, when the moving speed of the movable members 50 become smaller (the moving distance becomes smaller) in the order of the piezoelectric motors 11, 12, 13, and 14 through the use of the acceleration and deceleration mechanism, the movable members 50 can be stepwise finely positioned by sequentially driving the piezoelectric motors 11, 12, 13, and 14 through the switching of the relays 21, 22, 23, and 24.

The number of drive units disposed in the drive device 100 or the number of piezoelectric motors connected to a signal drive circuit 30 is not limited to the above-mentioned numbers. Plural piezoelectric motors may be connected to a single relay to simultaneously switch the electrical connection and disconnection between the plural piezoelectric motors and the drive circuit 30.

As described above, the configuration of the drive device 100 according to the first embodiment can achieve the following advantages.

(1) The relays 21, 22, 23, and 24 disposed between the piezoelectric motors 11, 12, 13, and 14 and the drive circuit 30 electrically connect or disconnect at least one of the piezoelectric motors 11, 12, 13, and 14 to or from the drive circuit 30. Accordingly, by switching and selectively driving the piezoelectric motor electrically connected to the drive circuit 30 through the use of the relays 21, 22, 23, and 24, it is possible to drive the common drive circuit 30 and the plural piezoelectric motors 11, 12, 13, and 14 in a time-division manner. As a result, it is possible to reduce the number of drive circuits 30 and the number of lines, compared with the number of piezoelectric motors 11, 12, 13, and 14. Since the piezoelectric motors are used, it is possible to make the brake mechanism disposed for each motor unnecessary, compared with the case where an electromagnetic motor or a pulse motor is used. As a result, it is possible to achieve a decrease in size, weight, and cost of the drive device 100.

(2) When the moving directions of the piezoelectric motors 11, 12, 13, and 14 are defined as three directions of the X direction, the Y direction, and the Z direction and the direction in which they rotate about the Z direction is defined as the θ direction, the operations of individually driving the piezoelectric motors 11, 12, 13, and 14 to cause the movable member 50 to move in the different directions of the X direction, the Y direction, the Z direction, and the θ direction can be individually performed by switching the relays 21, 22, 23, and 24. As a result, it is possible to easily and accurately cause the movable member 50 to move to a desired position.

(3) Since the relays 21, 22, 23, and 24 are disposed in the piezoelectric motors 11, 12, 13, and 14, respectively, the plural piezoelectric motors 11, 12, 13, and 14 can be individually driven through the use of a single drive circuit 30.

(4) Since each of the relays 21, 22, 23, and 24 is formed of a photo-MOS relay, the operation time of connection and disconnection is shorter, the power consumption is smaller, and the lifetime is longer, compared with the case where each relay is formed of a mechanical relay (electromagnetic relay). As a result, it is possible to provide a drive device 100 with higher performance and higher reliability.

Second Embodiment

Drive Device

A drive device according to a second embodiment of the invention will be described below. The drive device according to the second embodiment is different from the drive device according to the first embodiment, in that longitudinal vibration as well as the bending vibration is excited in the vibration member of the piezoelectric motor, and the other configurations are substantially equal to each other. The same elements as in the first embodiment are referenced by the same reference numerals and the description thereof will not be repeated.

Figure 6:
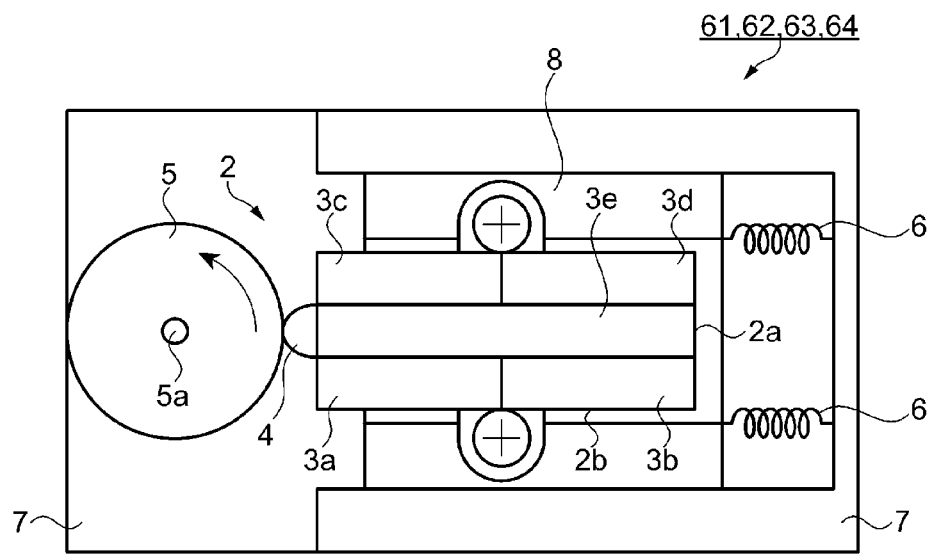
FIG. 6 is a diagram schematically illustrating the configuration of a piezoelectric motor used in a drive device according to a second embodiment of the invention.
Figure 7:
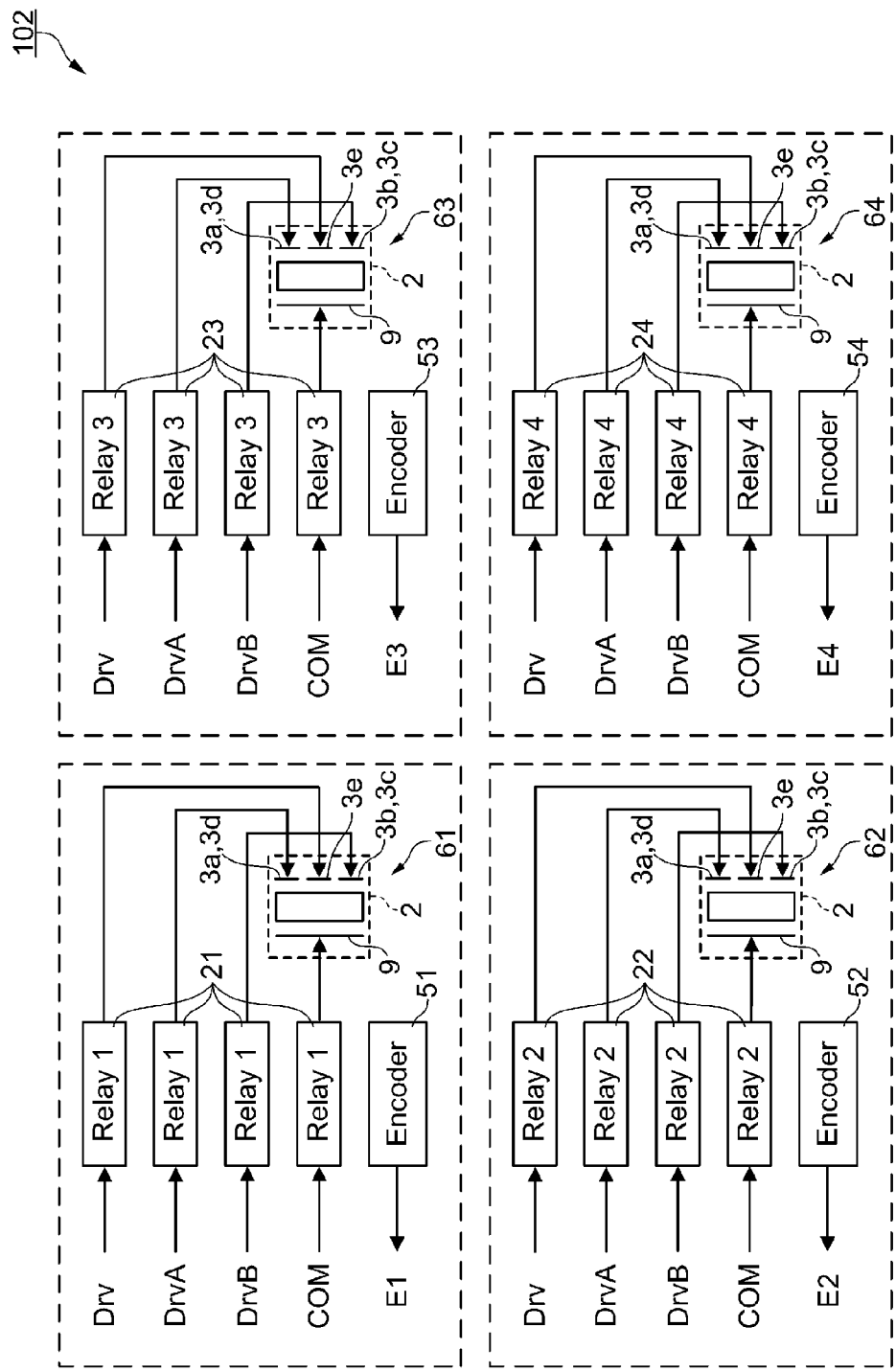
FIG. 7 is a block diagram illustrating the configuration of the drive device according to the second embodiment.
Figure 8:
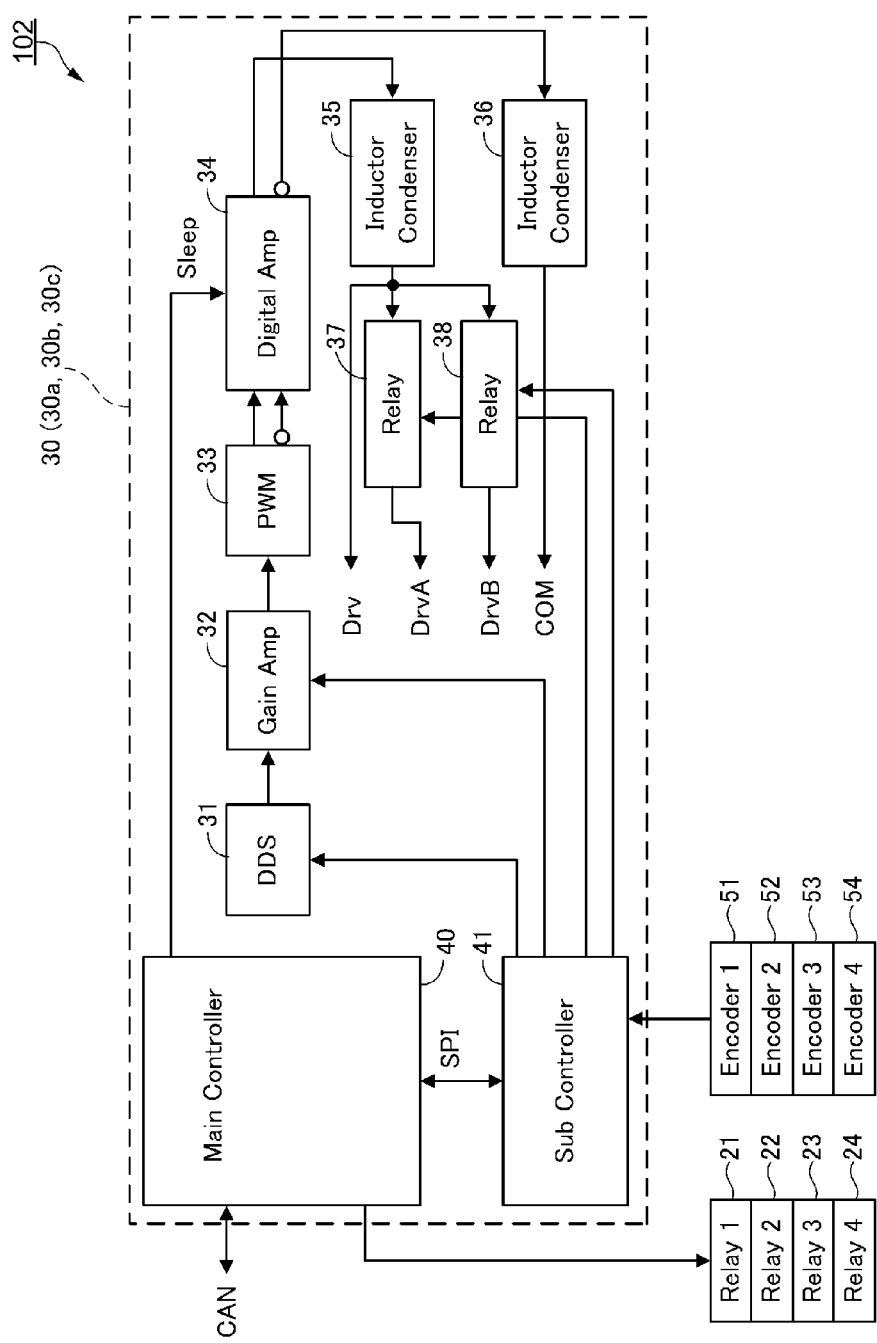
FIG. 8 is a block diagram illustrating the configuration of a drive circuit according to the second embodiment.

FIG. 6 is a diagram schematically illustrating the configuration of a piezoelectric motor used in the drive device according to the second embodiment. FIG. 7 is a block diagram illustrating the configuration of the drive device according to the second embodiment. FIG. 8 is a block diagram illustrating the configuration of a drive circuit according to the second embodiment.

Similarly to the drive device 100 according to the first embodiment, the drive device 102 according to the second embodiment includes three drive units (not shown), and each drive unit includes a drive unit 30, a piezoelectric motors 61, 62, 63, and 64, and relays 21, 22, 23, and 24. As shown in FIG. 6, each of the piezoelectric motors 61, 62, 63, and 64 includes a vibration member 2, a driven object 5, a support member 8, impelling springs 6, and a base 7.

The surface of the electrode 3 on the vibration member 2 is divided into five portions, and an electrode portion 3e is provided in addition to the electrode portions 3a, 3b, 3c, and 3d. The electrode portion 3e is disposed at the center in the short direction between the electrode portions 3a and 3b and the electrode portions 3c and 3d and has an area substantially equal to the total area of the electrode portions 3a and 3b (the total area of the electrode portions 3c and 3d). The electrode portion 3e serves as a longitudinal-vibration electrode. The longitudinal vibration means vibration in which the vibration member 2 expands and contracts in the long direction thereof.

As shown in FIG. 7, the piezoelectric motors 61, 62, 63, and 64 are electrically connected to or disconnected from the drive circuit 30 by the relays 21, 22, 23, and 24. The piezoelectric motor electrically connected to the drive circuit 30 is supplied with one of the first bending-vibration drive signal (DrvA) and the second bending-vibration drive signal (DrvB) and a longitudinal-vibration drive signal (Drv).

When the electrode portions 3a and 3d of the vibration member 2 are supplied with the first bending-vibration drive signal (DrvA) and the electrode portion 3e is supplied with the longitudinal-vibration drive signal (Drv), longitudinal vibration in which the vibration member expands and contracts in the long direction as well as the bending vibration in which the vibration member is bent in the short direction is excited in the vibration member 2. Since the sliding portion 4 slides to draw a clockwise elliptic orbit by the excitation of the vibration member 2 in the combination of the bending vibration and the longitudinal vibration, the driven object 5 rotates in the counterclockwise direction.

On the other hand, when the electrode portions 3c and 3b of the vibration member 2 are supplied with the second bending-vibration drive signal (DrvB) and the electrode portion 3e is supplied with the longitudinal-vibration drive signal (Drv), the vibration member 2 vibrates by the combination of the bending vibration and the longitudinal vibration and the sliding portion 4 slides to draw a counterclockwise elliptic orbit. Accordingly, the driven object 5 rotates in the clockwise direction.

As shown in FIG. 8, the drive circuit 30 of the drive device 102 according to the second embodiment has the same configuration as in the first embodiment, except that the longitudinal-vibration drive signal (Drv) is output. The longitudinal-vibration drive signal (Drv) is output from the inductor condenser 35, regardless of the operations of the relays 37 and 38.

In this way, the drive device 102 according to the second embodiment includes the piezoelectric motors 61, 62, 63, and 64 in which the electrode on the vibration member 2 is divided into five portions and the longitudinal-vibration electrode portion 3e is provided in addition to the bending-vibration electrode portions 3a, 3b, 3c, and 3d, and similarly to the first embodiment, the piezoelectric motors are selectively electrically connected to the drive circuit 30 through the use of the relays 21, 22, 23, and 24. As a result, the drive device 102 according to the second embodiment can also achieve the same advantages as in the drive device 100 according to the first embodiment.

Third Embodiment

Electronic Component Transporting Apparatus and Electronic Component Inspecting Apparatus An electronic component transporting apparatus and an electronic component inspecting apparatus according to a third embodiment of the invention will be described below. The electronic component transporting apparatus and the electronic component inspecting apparatus according to the third embodiment include a positioning mechanism having the same configuration as the basic configuration of the drive device according to the first embodiment. The same elements as in the first embodiment will be referenced by the same reference numerals and description thereof will not be repeated.

Figure 9A:
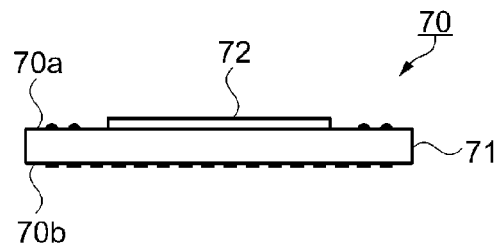
FIGS. 9A to 9C are diagrams illustrating examples of an electronic component according to a third embodiment of the invention.
Figure 9B:
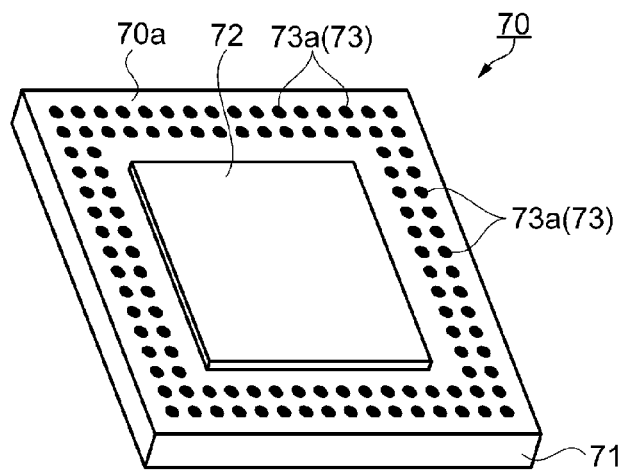
Figure 9C:
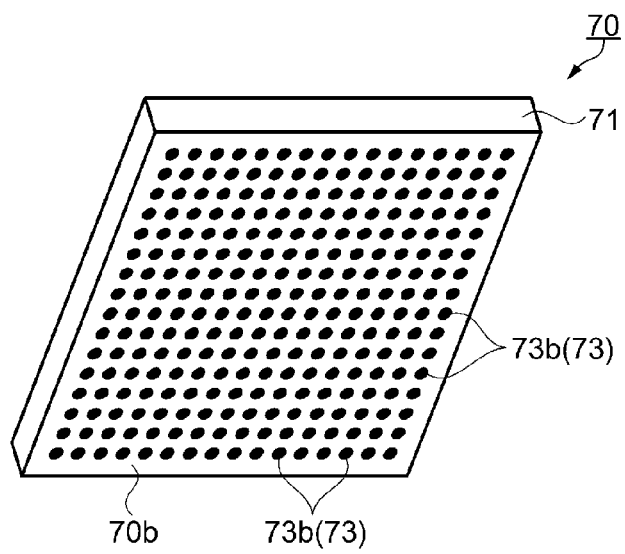

First, an example of an electronic component which is transported or inspected by the electronic component transporting apparatus or the electronic component inspecting apparatus according to the third embodiment will be described below. FIGS. 9A to 9C are diagrams illustrating an example of an electronic component according to the third embodiment. Specifically, FIG. 9A is a side view schematically illustrating the structure of an electronic component, and FIGS. 9B and 9C are perspective views schematically illustrating the structure of the electronic component. FIG. 9B illustrates a surface on which a semiconductor device is formed and FIG. 9C illustrates a surface on which only electrodes are formed.

As shown in FIGS. 9A, 9B, and 9C, an electronic component 70 includes a rectangular board 71. One surface of the board 71 is defined as a first surface 70a and the other surface thereof is defined as a second surface 70b. As show in FIG. 9B, the first surface 70a is provided with a rectangular semiconductor chip 72 and first electrodes 73a arranged in two lines are disposed around the semiconductor chip. As shown in FIG. 9C, second electrodes 73b are arranged in a lattice shape on the second surface 70b. An interconnection layer and an insulating layer are stacked in the board 71, and the semiconductor chip 72 is connected to the electrodes 73 including the first electrodes 73a and the second electrodes 73b via interconnections of the interconnection layer.

Figure 10:
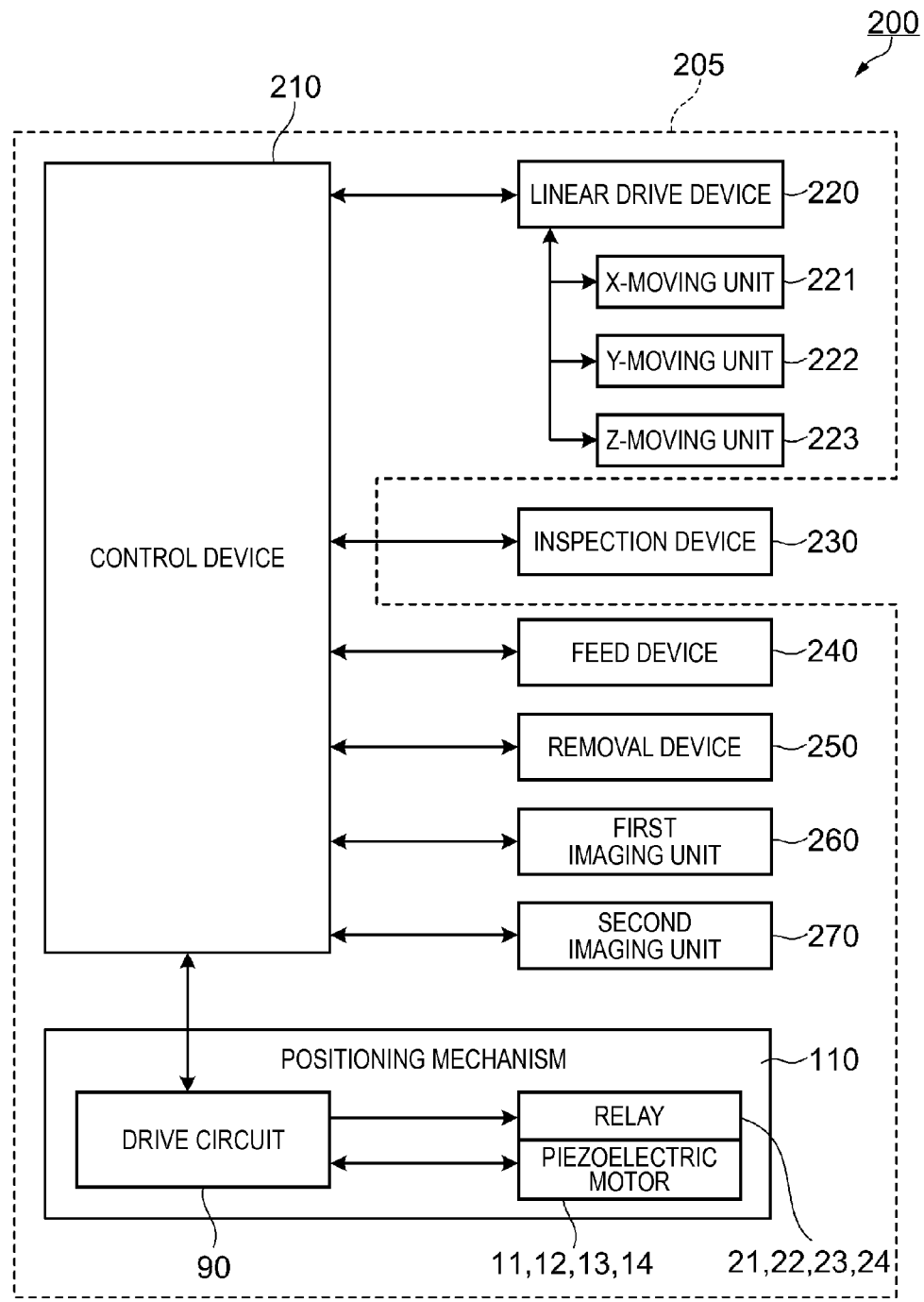
FIG. 10 is a block diagram schematically illustrating the configuration of an electronic component transporting apparatus and an electronic component inspecting apparatus according to the third embodiment.
Figure 11A:
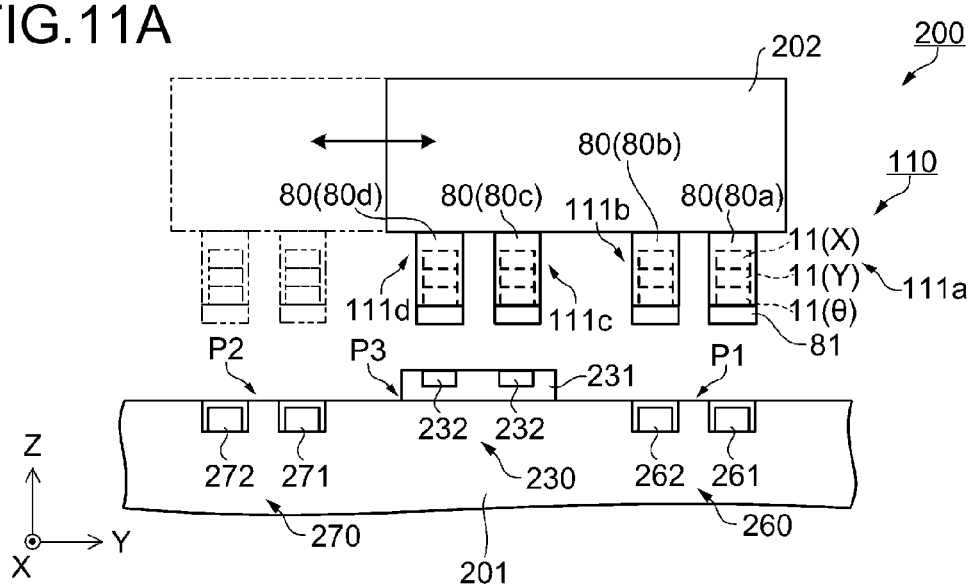
FIGS. 11A and 11B are diagrams illustrating the partial configuration of the electronic component inspecting apparatus according to the third embodiment.
Figure 11B:
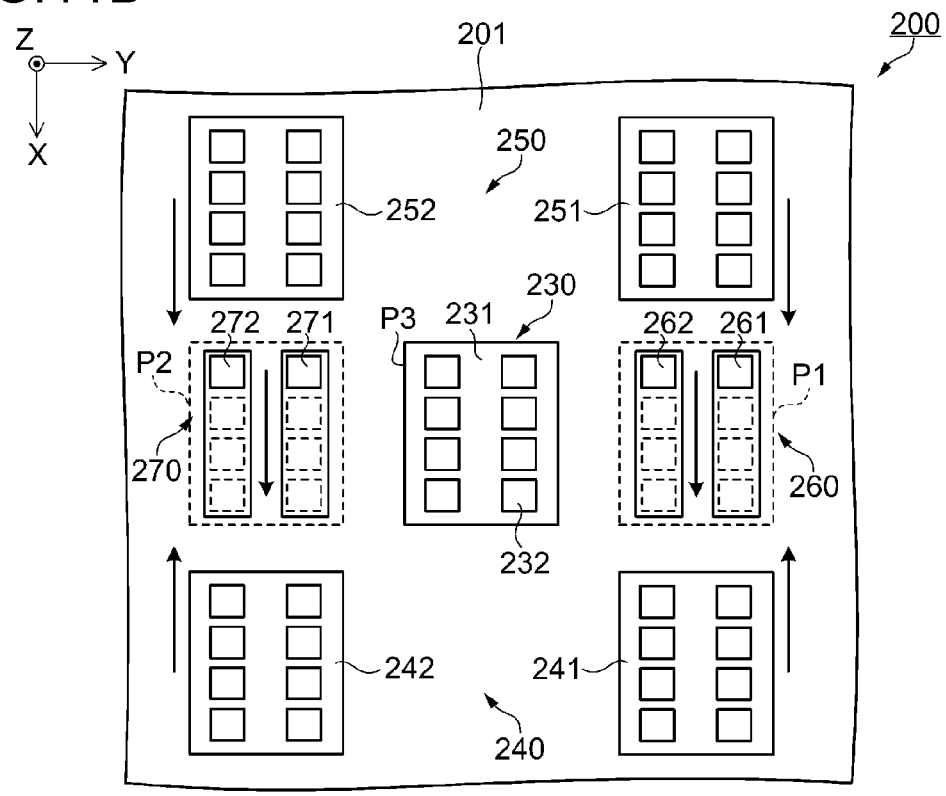
Figure 12A:
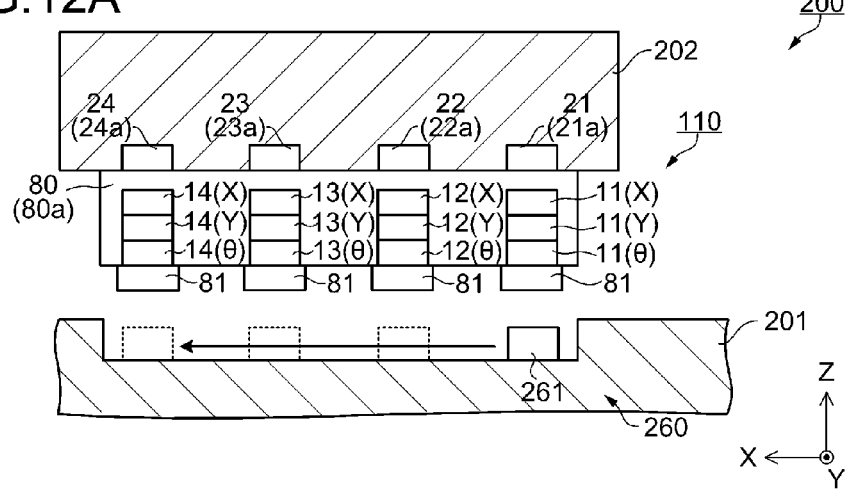
FIGS. 12A to 12C are diagrams illustrating the partial configuration of the electronic component inspecting apparatus according to the third embodiment.
Figure 12B:
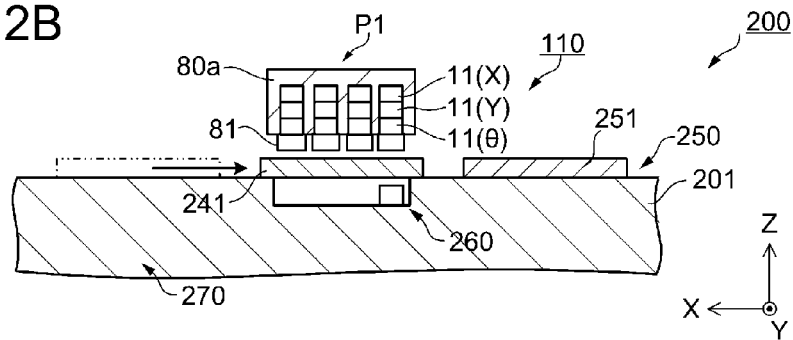
Figure 12C:
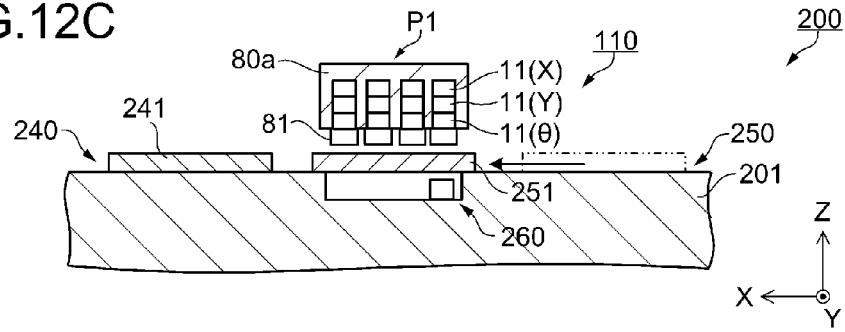

The schematic configurations of the electronic component transporting apparatus and the electronic component inspecting apparatus according to the third embodiment will be described below. FIG. 10 is a block diagram schematically illustrating the configuration of the electronic component transporting apparatus and the electronic component inspecting apparatus according to the third embodiment. FIGS. 11A and 11B and FIGS. 12A to 12C are diagrams illustrating a partial configuration of the electronic component inspecting apparatus according to the third embodiment. Specifically, FIG. 11A is a front view of the electronic component inspecting apparatus 200 and FIG. 11B is a top view of the electronic component inspecting apparatus 200. FIGS. 12A, 12B, and 12C are cross-sectional views of the electronic component inspecting apparatus 200. In FIGS. 11A and 11B and FIGS. 12A to 12C, the electronic component 70 is not shown.

As shown in FIG. 10, the electronic component inspecting apparatus 200 according to the third embodiment includes a control device 210, a linear drive device 220 as a linearly-moving mechanism, an inspection device 230, a feed device 240, a removal device 250, a first imaging unit 260, a second imaging unit 270, and a positioning mechanism 110. The linear drive device 220, the inspection device 230, the feed device 240, the removal device 250, the first imaging unit 260, the second imaging unit 270, and the positioning mechanism 110 are connected to the control device 210 via an input and output interface.

The electronic component transporting apparatus 205 according to the third embodiment has the same configuration as the electronic component inspecting apparatus 200, except that it does not include the inspection 230. Hereinafter, the electronic component inspecting apparatus 200 will be described, but the same is true of the electronic component inspecting apparatus 205, except for the description of the inspection unit 230.

The control device 210 controls the overall operation of the electronic component inspecting apparatus 200. The control device 210 includes a CPU as a processor performing various operating processes and a memory storing a variety of information.

In the memory, a memory area storing a program in which the control procedure of the operations of the electronic component inspecting apparatus 200 is described, a memory area storing coordinate data of the shape of the electronic component 70 or electrodes, a memory area storing coordinate data of probe positions of the inspection device 230, and the like are defined. The CPU serves to operate the units of the electronic component inspecting apparatus 200 in accordance with the program stored in the memory to inspect electrical characteristics of the electronic component 70.

The linear drive device 220 includes an X moving unit 221, a Y moving unit 222, and a Z moving unit 223 linearly moving (moving forward and backward) in the X direction, the Y direction, and the Z direction, respectively, by a linear motor or the like and drives the moving units. In FIGS. 11A and 11B, the front side in the horizontal direction is defined as the X direction which is a second direction, a direction (the right side in the front view) perpendicular to the X direction in the horizontal plane is defined as the Y direction which is a first direction, and a direction (the upper side in the vertical direction) perpendicular to the X direction and the Y direction is defined as the Z direction.

As shown in FIG. 11A, the electronic component inspecting apparatus 200 includes a base 201 and a support unit 202. The base 201 has a substantially rectangular parallelepiped shape. The support unit 202 is supported by the linear drive device 220 (see FIG. 10) disposed in the base 201, and moves in the X direction, the Y direction, and the Z direction relative to the base 201 by causing the linear drive device 220 to drive the X moving unit 221, the Y moving unit 222, and the Z moving unit 223 (see FIG. 10). The control device 210 is disposed at a position separated from the support unit 202, such as an end portion in the Y direction of the base 201.

The support unit 202 is provided with a movable unit 81 holding an electronic component 70 and moving, a head 80 movably holding the movable unit 81, and a positioning mechanism 110 causing the movable unit 81 to move in a predetermined direction. The head 80 is disposed on the base 201 side (in the −Z direction) of the support unit 202 and includes four heads 80a, 80b, 80c, and 80d.

By causing the support unit 202 to move (reciprocate) in the Y direction through the use of the linear drive device 220, the heads 80a and 80b move (reciprocate) between a positioning place P1 and an inspection place P3, and the heads 80c and 80d move (reciprocate) between a positioning place P2 and an inspection place P3. With respect to the inspection place P3, the positioning place P1 is located on the right side (in the Y direction) of the drawing and the positioning place P2 is located on the left side (in the −Y direction) of the drawing.

As shown in FIGS. 12A, 12B, and 12C, four movable units 81 are arranged on the base 201 side (in the −Z direction) of each head 80 and 16 movable units are arranged in total. A suction unit (not shown) is disposed substantially at the center of each movable unit 81, and an electronic component 70 can be held on the base 201 side by suctioning air in a flow channel disposed in the suction unit through the use of a vacuum pump or the like. FIGS. 12A, 12B, and 12C schematically illustrate a cross-section obtained by taking the base 201 along the X direction at the position of the head 80a.

As shown in FIG. 11A, the positioning mechanism 110 includes four drive units 111a, 111b, 111c, and 111d. The drive units 111a, 111b, 111c, and 111d are arranged in the heads 80a, 80b, 80c, and 80d to correspond to a, b, c, and d added to the reference numerals. The positioning mechanism 110 is a positioning mechanism having the basic configuration of the drive device 100 according to the first embodiment.

The movable units 81 can be made to move by the positioning mechanism 110 to move and locate an electronic component 70 at a predetermined position. The configuration of the positioning mechanism 110 will be described later.

The inspection device 230 is a device inspecting electrical characteristics of an electronic component 70. As shown in FIGS. 11A and 11B, the inspection device 230 is disposed in the inspection place P3 on the top surface of the base 201 and includes an inspection table 231. Eight inspection sockets 232 are disposed in the inspection table 231. Plural probes (not shown) transmitting and receiving an electric signal for inspection are disposed in each inspection socket 232. When an electronic component 70 supported by the movable unit 81 is inserted, the probes is brought into contact with and electrically connected to the electrodes of the electronic component 70.

The feed device 240 illustrated in FIG. 11B is a device feeding an electronic component 70 to be inspected. The feed device 240 includes feed trays 241 and 242 on which an electronic component 70 to be inspected is placed and a linearly-moving mechanism (not shown) causing the feed trays 241 and 242 to move linearly through the use of a linear motor or the like. The feed trays 241 and 242 are arranged in the Y direction.

Only the feed tray 241 is illustrated in FIG. 12B, the feed trays 241 and 242 move in the X direction through the use of the linearly-moving mechanism and reciprocates between a position (the positioning places P1 and P2) at which an electronic component 70 is fed to the movable unit 81 and a position (the X side of the positioning place P1 and P2) at which an electronic component 70 is placed on the feed tray.

The removal device 250 illustrated in FIG. 11B is a device removing an electronic component 70 of which the inspection is completed. The removal device 250 includes a recovery trays 251 and 252 on which an electronic component 70 having been inspected is placed and a linearly-moving mechanism (not shown) causing the recovery trays 251 and 252 to move linearly through the use of a linear motor or the like. The recovery trays 251 and 252 are arranged in the Y direction.

Only the recovery tray 251 is illustrated in FIG. 12C, but the recovery trays 251 and 252 move in the X direction through the use of the linearly-moving mechanism and reciprocates between a position (the positioning places P1 and P2) at which an electronic component 70 is recovered from the movable unit 81 and a position (the −X side of the positioning places P1 and P2) at which an electronic component 70 is removed from the recovery trays.

The first imaging unit 260 illustrated in FIGS. 11A and 11B is disposed at the positioning place P1 and includes two imaging devices 261 and 262. In the positioning place P1, a groove being concave from the top surface of the base 201 and extending in the X direction is formed. The imaging devices 261 and 262 are arranged in the Y direction in the groove. The imaging devices 261 and 262 are constructed by a CCD (Charge Coupled Devices) converting received light into an electrical signal or the like.

Only the imaging device 261 is illustrated in FIG. 12A, but the imaging devices 261 and 262 move (reciprocate) in the X direction in the groove through the use of a linearly-moving mechanism (not shown) and output an image of an electronic component 70 supported and opposed by the movable unit 81. In the positioning place P1, the arrangement positions of two electronic components 70 can be optically recognized at once by the use of the imaging devices 261 and 262. By causing the imaging devices 261 and 262 to move in the X direction, the arrangement position of eight electronic components 70 in total can be optically recognized.

The second imaging unit 270 illustrated in FIGS. 11A and 11B is disposed in the positioning place P2 and includes two imaging devices 271 and 272. In the positioning place P2, a groove being concave from the top surface of the base 201 and extending in the X direction is formed. The imaging devices 271 and 272 are arranged in the Y direction in the groove. The imaging devices 271 and 272 are constructed by the same elements as the imaging devices 261 and 262, and move (reciprocate) in the X direction in the groove and output an image of an electronic component 70, similarly to the imaging devices 261 and 262. As a result, in the positioning place P2, the arrangement positions of eight electronic components 70 in total by two at a time can also be optically recognized.

Positioning Mechanism

Figure 13:
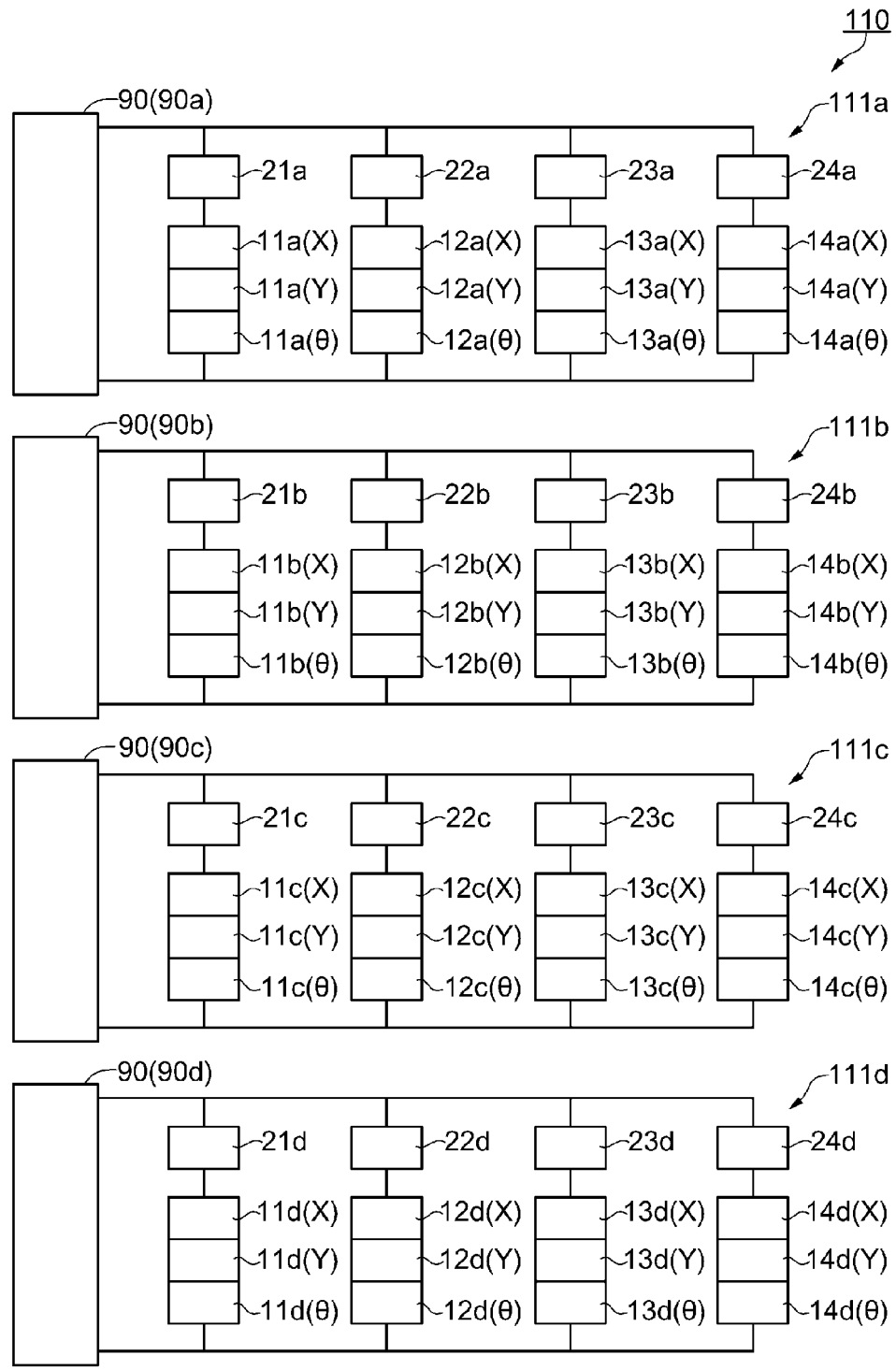
FIG. 13 is a block diagram schematically illustrating the configuration of a positioning mechanism of the electronic component inspecting apparatus according to the third embodiment.

The configuration of the positioning mechanism 110 will be described below with reference to FIG. 13. FIG. 13 is a block diagram schematically illustrating the configuration of the positioning mechanism of the electronic component inspecting apparatus according to the third embodiment.

As shown in FIG. 13, the positioning mechanism 110 a multi-axis positioning mechanism including 12 piezoelectric motors 11, 12, 13, and 14 for each of four drive units 111a, 111b, 111c, and 111d and driving 48 (48-axis) piezoelectric motors through the use of four drive circuits 90a, 90b, 90c, and 90d. The drive units 111a, 111b, 111c, and 111d have the same configuration, and the drive units 111, the relays 21, 22, 23, and 24, and the piezoelectric motors 11, 12, 13, and 14 are distinguished by a, b, c, and d added to the reference numerals. Specifically, the drive unit 111a has the iezoelectric motors 11a(X, Y, θ), 12a(X, Y, θ), 13a(X, Y, θ) and 14a(X, Y, θ) that are respectively controlled by the relays 21a-24a. The drive unit 111b has the piezoelectric motors 11b(X, Y, θ), 12b(X, Y, θ) 13b(X, Y, θ) and 14b(X, Y, θ) that are respectively controlled by the relays 21b-24b. The drive unit 111c has the piezoelectric motors 11c(X, Y, θ), 12c(X, Y, θ), 13c(X, Y, θ) and 14c(X, Y, θ) that are respective controlled by the relays 21c-24c. Lastly, the drive unit 111d has the piezoelectric motors 11d(X, Y, θ), 12d(X, Y, θ), 13d(X, Y, θ) and 14d(X, Y, θ) that are respectively controlled by the relays 21d-24d. Hereinafter, a, b, c, and d added to the reference numerals will not be marked in description.

Each drive unit 111 includes a drive circuit 90, four relays 21, 22, 23, and 24 and twelve piezoelectric motors 11(X), 11(Y), 11(θ), 12(X), 12(Y), 12(θ), 13(X), 13(Y), 13(θ), 14(X), 14(Y), and 14(θ). The twelve piezoelectric motors have the same configuration, and (X), (Y), and (θ) added to the reference numerals of the piezoelectric motors represent that the respective piezoelectric motors cause the movable unit 81 (see FIGS. 11A and 11B) in the X direction, the Y direction, and the θ direction. Here, the θ direction is a direction in which the movable unit rotates about the Z direction in the plane formed by the X direction and the Y direction.

Hereinafter, the piezoelectric motors 11, 12, 13, and 14 causing the movable unit 81 to move in the X direction are collectively referred to as an X-direction piezoelectric motor as the second piezoelectric motor. The piezoelectric motors 11, 12, 13, and 14 causing the movable unit 81 to move in the Y direction are collectively referred to as a Y-direction piezoelectric motor as the first piezoelectric motor. The piezoelectric motors 11, 12, 13, and 14 causing the movable unit 81 to move in the θ direction are collectively referred to as a θ-direction piezoelectric motor.

Three piezoelectric motors 11(X, Y, θ) are connected to the relay 21. Through the switching of the relay 21, three piezoelectric motors 11(X, Y, θ) are electrically connected to or disconnected from the drive circuit 90. Similarly, the piezoelectric motors 12(X, Y, θ) are connected to the relay 22, the piezoelectric motors 13(X, Y, θ) are connected to the relay 23, and the piezoelectric motors 14(X, Y, θ) are connected to the relay 24.

The drive circuit 90 has the same configuration as the drive circuit 30 in the first embodiment, and includes three oscillators 31, three gain amplifiers 32, three PWM units 33, three digital amplifiers 34, three sets of inductor condensers 35 and 36, and three sets of relays 37 and 38, in order to drive three piezoelectric motors 11(X, Y, θ).

Although not shown in the drawing, the selection signal and the drive signal are output from the drive circuit 90 to the relays 21, 22, 23, and 24 and the piezoelectric motors 11(X, Y, θ), 12(X, Y, θ), 13(X, Y, θ), and 14(X, Y, θ), and the encoder signal from the encoders are fed back to the drive circuit 90. Therefore, twelve piezoelectric motors 11(X, Y, θ), 12(X, Y, θ), 13(X, Y, θ), and 14(X, Y, θ) can be switched between the state where they are electrically connected to the drive circuit 90 and the state where they are electrically disconnected from the drive circuit 90 through the use of four relays 21, 22, 23, and 24.

As shown in FIG. 12A, the relays 21, 22, 23, and 24 are disposed in the support unit 202. The piezoelectric motors are disposed in the head 80, and are arranged, for example, in the order of the piezoelectric motors 11(X), 11(Y), and 11(θ) from the Z direction. That is, the X-direction piezoelectric motor causing the movable unit 81 to move in the X direction is disposed higher than the Y-direction piezoelectric motor causing the movable unit 81 to move in the Y direction. On the other hand, the drive circuit 90 along the control device 210 (not shown) is disposed at a position separated from the piezoelectric motors, such as an end in the Y direction of the base 201.

In this way, since the positioning mechanism 110 drives twelve piezoelectric motors 11(X, Y, θ), 12(X, Y, θ), 13(X, Y, θ), and 14(X, Y, θ) through the use of the common drive circuit 90, it is possible to reduce the number of drive circuits 90 and the number of lines in comparison with the number of piezoelectric motors. Therefore, it is possible to achieve a decrease in size, weight, and cost of the positioning mechanism 110.

Since the number of lines between the drive circuit 90 and the piezoelectric motors 11(X, Y, θ), 12(X, Y, θ), 13(X, Y, θ), and 14(X, Y, θ) which are separated from each other can be reduced, the load based on the weight of the lines or the restraining force due to the bundle of lines when causing the supporting unit 202 or the movable unit 81 to move is suppressed. Accordingly, it is possible to more easily and accurately position the support unit or the movable unit.

Drive Control Method of Positioning Mechanism

The drive control method of the positioning mechanism 110 and the operation of the electronic component inspecting apparatus 200 associated with the positioning will be described with reference to FIGS. 14A and 14B. FIGS. 14A and 14B are diagrams illustrating the drive control method of the positioning mechanism of the electronic component inspecting apparatus according to the third embodiment. FIGS. 14A and 14B are views in which the electronic component inspecting apparatus 200 is viewed from the upside (the Z direction).

Positioning in Heads 80a and 80b

In FIG. 14A, the heads 80a and 80b are located in the positioning place P1 and the heads 80c and 80d are located in the inspection place P3. In the heads 80a and 80b, the feed tray 241 (see FIG. 11B) move to the positioning place P1, and electronic components 70 (not shown) are fed to and held in the eight movable units 81 in total. The feed tray 241 moves in the X direction from the positioning place P1, and sequentially positions the eight electronic components 70 held in the movable units 81 of the heads 80a and 80b by two electronic components at a time in the positioning place P1.

Here, the imaging devices 261 and 262 are located at positions overlapping with the movable units 81 on the −X side. The piezoelectric motors 11a(X, Y, θ) and 11b(X, Y, θ) are driven to cause the movable units 81 to move in the X direction, the Y direction, and the θ direction and to position the piezoelectric motors at predetermined positions while optically recognizing the arrangement positions of two electronic components 70 held in the movable units 81 at the respective positions by the use of the imaging devices 261 and 262. At this time, only the piezoelectric motors 11a(X, Y, θ) and 11b(X, Y, θ) are driven in the heads 80a and 80b in response to the selection signal from the drive circuit 90.

Subsequently, the imaging devices 261 and 262 move in the X direction and are located at positions overlapping with the second movable unit 81 from the −X side, and only the piezoelectric motors 12a(X, Y, θ) and 12b(X, Y, θ) are driven to position two next electronic components 70. In this way, by causing the imaging devices 261 and 262 to move in the X direction and sequentially switching and driving the piezoelectric motors, the positioning of eight electronic components 70 in the heads 80a and 80b are completed.

Electrical Characteristic Inspection in Heads 80c and 80d

In the inspection place P3, eight electronic components 70 in the heads 80c and 80d are inserted into the inspection sockets 232 (see FIG. 11B) and the electrical characteristics of the eight electronic components 70 are inspected, while the electronic components 70 in the heads 80a and 80b are being positioned in the positioning place P1.

When the positioning in the positioning place P1 and the electrical characteristic inspection in the inspection place P3 are ended, the support unit 202 (see FIG. 11A) is made to move in the −Y direction by the use of the linear drive device 220 (see FIG. 10). Accordingly, as shown in FIG. 14B, the heads 80a and 80b are located in the inspection place P3 and the heads 80c and 80d are located in the positioning place P2.

Positioning in Heads 80c and 80d

In the heads 80c and 80d, the recovery tray 252 (see FIG. 11B) moves to the positioning place P2 and recovers the inspected electronic components 70 from the eight movable units 81 in total. The recovery tray 252 moves in the −X direction from the positioning place P2, the feed tray 242 (see FIG. 11B) moves to the positioning place P2, and eight electronic components 70 to be inspected are held in the movable units 81 of the heads 80c and 80d. The feed tray 242 moves in the X direction from the positioning place P2, and sequentially positions the eight electronic components 70 by two electronic components at a time in the positioning place P2.

Here, the imaging devices 271 and 272 are located at positions overlapping with the movable units 81 on the −X side, and the piezoelectric motors 11c(X, Y, θ) and 11d(X, Y, θ) are driven and positioned at predetermined positions while optically recognizing the arrangement positions of two electronic components 70. By sequentially causing the imaging devices 271 and 272 to move in the X direction and switching and driving the piezoelectric motors, the positioning of eight electronic components 70 in the heads 80c and 80d are completed.

Electrical Characteristic Inspection in Heads 80a and 80b

In the inspection place P3, eight electronic components 70 in the heads 80a and 80b are inserted into the inspection sockets 232 and the electrical characteristics of the eight electronic components 70 are inspected, while the electronic components 70 in the heads 80c and 80d are being positioned in the positioning place P2.

When the positioning in the positioning place P2 and the electrical characteristic inspection in the inspection place P3 are ended, the support unit 202 is made to move in the Y direction by the use of the linear drive device 220. Accordingly, as shown in FIG. 14A, the heads 80a and 80b are located in the positioning place P1 and the heads 80c and 80d are located in the inspection place P3. In the heads 80a and 80b, the recovery tray 251 (see FIG. 11B) moves to the positioning place P1 and recovers the electronic components 70 from the eight movable units 81 in total.

Thereafter, similarly, the positioning and the electrical characteristic inspection in the heads 80a and 80b and the positioning and the electrical characteristic inspection in the heads 80c and 80d are repeated.

Whenever the positioning and the electrical characteristic inspection are repeated, the support unit 202 repeatedly reciprocates in the Y direction by the use of the linear drive device 220. Then, 48 piezoelectric motors disposed in the heads 80a, 80b, 80c, and 80d repeatedly reciprocate in the Y direction in the non-driven state along with the support unit 202. The moving speed and the moving distance of the movement in the Y direction by the linear drive device 220 are both greater than those of the movement in the Y direction by the piezoelectric motors.

Accordingly, for every movement in the Y direction by the linear drive device 220, the inertial force in the Y direction acts on the 48 piezoelectric motors. The piezoelectric motors are held not to move by the frictional force between the drive object 5 and the sliding portion 4 in the non-driven state (see FIG. 2), but may move and shift from the determined position when the inertial force is great. In this case, the Y-direction piezoelectric motors having the same moving direction as the linearly-moving direction by the linear drive device 220 move more easily than the X-direction piezoelectric motors or the θ-direction piezoelectric motors. As the gravitational force applied to the Y-direction piezoelectric motor becomes greater, the inertial force becomes greater, and thus the Y-direction piezoelectric motor can move more easily.

Therefore, in the positioning mechanism 110, the Y-direction piezoelectric motor is disposed to be closer to the movable unit 81 in the −Z direction than, that is, vertically below, the X-direction piezoelectric motor. Accordingly, since the gravitational force of the X-direction piezoelectric motor is not applied to the Y-direction piezoelectric motor, it is possible to suppress the inertial force acting on the Y-direction piezoelectric motor, compared with a case where the Y-direction piezoelectric motor is disposed above the X-direction piezoelectric motor. As a result, even when the support unit 202 repeatedly reciprocates in the Y direction through the use of the linear drive device 220, it is possible to suppress the positional shift due to the movement of the Y-direction piezoelectric motor with the inertial force.

The positioning mechanism 110 can be applied to any of the configuration in which the electrode of the vibration member 1 in the first embodiment is divided into four portions and the configuration in which the electrode of the vibration member 2 in the second embodiment is divided into five portions. The number of drive units in the positioning mechanism 110 or the number of piezoelectric motors connected to a single drive circuit 90 is not limited to the above-mentioned values, but a relay may be disposed for each piezoelectric motor.

As described above, in the configuration of the positioning mechanism 110 of the electronic component inspecting apparatus 200 according to the third embodiment, the following advantages can be achieved.

(1) Since twelve piezoelectric motors 11(X, Y, θ), 12(X, Y, θ), 13(X, Y, θ), and 14(X, Y, θ) are driven through the use of the common drive circuit 90, it is possible to reduce the number of drive circuits 90 and the number of lines in comparison with the number of piezoelectric motors. Therefore, it is possible to achieve a decrease in size, weight, and cost of the positioning mechanism 110.

Since the number of lines between the drive circuit 90 and the piezoelectric motors 11(X, Y, θ), 12(X, Y, θ), 13(X, Y, θ), and 14(X, Y, θ) which are separated from each other can be reduced, the load based on the weight of the lines or the restraining force due to the bundle of lines when causing the supporting unit 202 or the movable unit 81 to move is suppressed. Accordingly, it is possible to more easily and accurately position the support unit or the movable unit.

(2) The Y-direction piezoelectric motor is disposed vertically below the X-direction piezoelectric motor. Accordingly, compared with a case where the Y-direction piezoelectric motor is disposed above the X-direction piezoelectric motor, it is possible to suppress the inertial force acting on the Y-direction piezoelectric motor by the gravitational force of the X-direction piezoelectric motor. As a result, even when the support unit repeatedly reciprocates in the Y direction, it is possible to suppress the positional shift due to the movement of the Y-direction piezoelectric motor with the inertial force.

Fourth Embodiment

Robot Hand and Robot

A robot hand and a robot according to a fourth embodiment of the invention will be described. The robot hand and the robot according to the fourth embodiment include a drive device having the same configuration as the drive device according to the first embodiment as a drive device of a joint. The same elements as in the first embodiment will be referenced by the same reference numerals and description thereof will not be repeated.

Figure 15A:
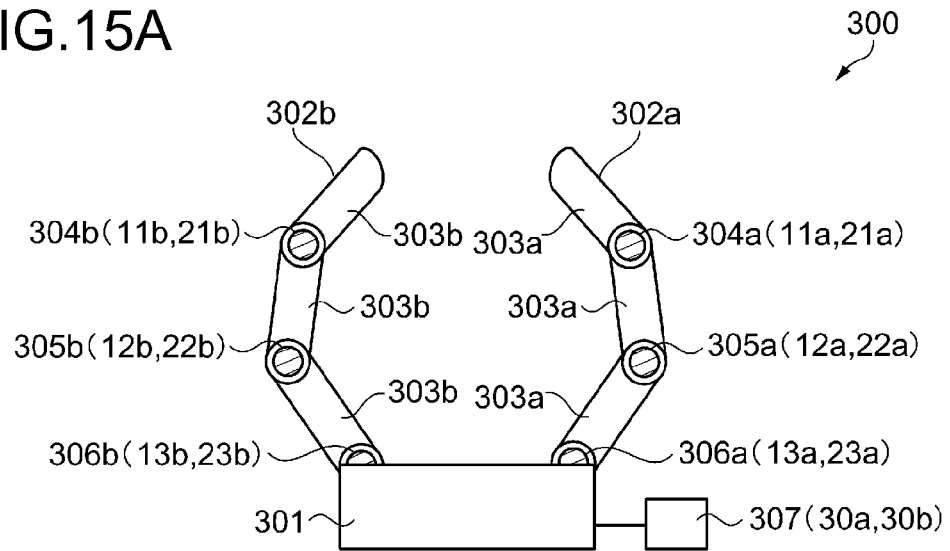
FIGS. 15A and 15B are diagrams schematically illustrating the structures of a robot hand and a robot according to a fourth embodiment of the invention.
Figure 15B:
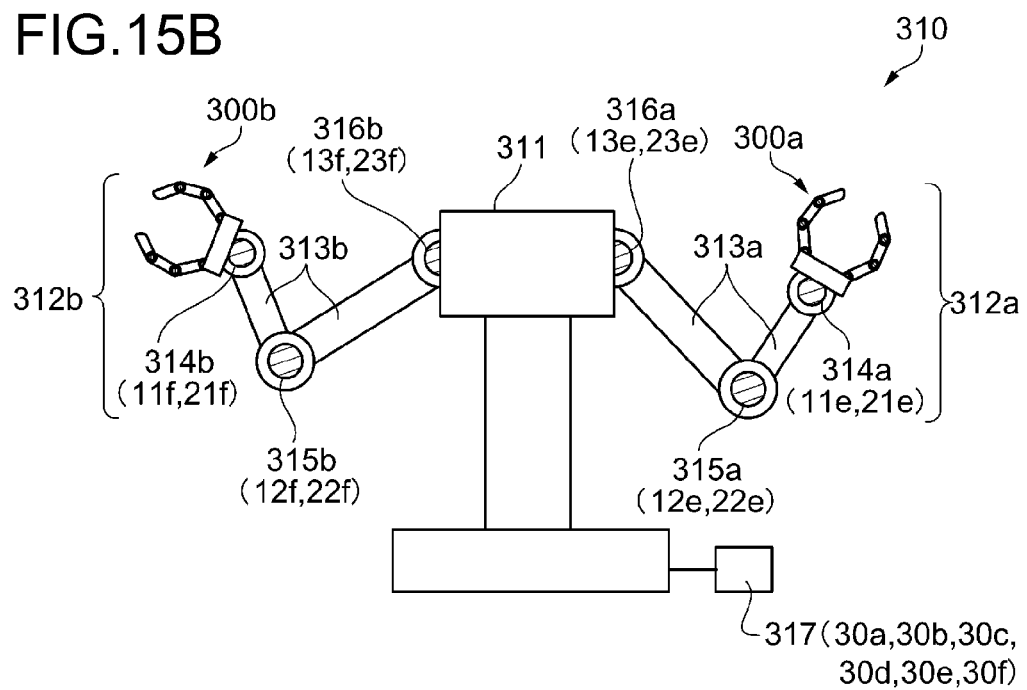

FIGS. 15A and 15B are diagrams schematically illustrating the structures of the robot hand and the robot according to the fourth embodiment. FIG. 15A is a diagram schematically illustrating the structure of the robot hand. As shown in FIG. 15A, the robot hand 300 includes a hand base 301, two fingers 302a and 302b, and a control device 307. The two fingers 302a and 302b are attached to the hand base 301.

The finger 302a includes three joints 304a, 305a, and 306a as a movable unit and three finger members 303a which are alternately connected. Piezoelectric motors 11a, 12a, and 13a and relays 21a, 22a, and 23a are disposed in the joints 304a, 305a, and 306a, respectively. The finger 302b includes three joints 304b, 305b, and 306b as a movable unit and three finger members 303b which are alternately connected. Piezoelectric motors 11b, 12b, and 13b and relays 21b, 22b, and 23b are disposed in the joints 304b, 305b, and 306b, respectively.

The control device 307 includes drive circuits 30a and 30b. The piezoelectric motors 11a, 12a, and 13a and the relays 21a, 22a, and 23a are connected to the drive circuit 30a. By the switching of the relays 21a, 22a, and 23a based on a selection signal from the drive circuit 30a, the piezoelectric motors 11a, 12a, and 13a are driven in a time-division manner and the joints 304a, 305a, and 306a rotate. Similarly, the piezoelectric motors 11b, 12b, and 13b and the relays 21b, 22b, and 23b are connected to the drive circuit 30b. By the switching of the relays 21b, 22b, and 23b based on a selection signal from the drive circuit 30b, the piezoelectric motors 11b, 12b, and 13b are driven in a time-division manner and the joints 304b, 305b, and 306b rotate. As a result, it is possible to transform the fingers 302a and 302b in a desired shape as if they were human fingers.

FIG. 15B is a diagram schematically illustrating the structure of the robot. As shown in FIG. 15B, the robot 310 includes a robot body 311, two arms 312a and 312b, and a control device 317. Two arms 312a and 312b are attached to the robot body 311.

The arm 312a includes three joints 314a, 315a, and 316a as a movable unit and two arm members 313a which are alternately connected. Piezoelectric motors 11e, 12e, and 13e and relays 21e, 22e, and 23e are disposed in the joints 314a, 315a, and 316a, respectively. One end of the arm 312a is attached to the robot body 311, and a robot hand 300a is attached to the other end thereof. The robot hand 300a has the same configuration as shown in FIG. 15A.

The arm 312b includes three joints 314b, 315b, and 316b as a movable unit and two arm members 313b which are alternately connected. Piezoelectric motors 11f, 12f, and 13f and relays 21f, 22f, and 23f are disposed in the joints 314b, 315b, and 316b, respectively. One end of the arm 312b is attached to the robot body 311, and a robot hand 300b is attached to the other end thereof. The robot hand 300b has the same configuration as shown in FIG. 15A, and three piezoelectric motors and three relays (not shown) connected to drive circuits 30c and 30d are disposed in the joints, respectively.

Drive circuits 30a, 30b, 30c, 30d, 30e, and 30f are disposed in the control device 317. The piezoelectric motors 11e, 12e, and 13e and the relays 21e, 22e, and 23e are connected to the drive circuit 30e. By the switching of the relays 21e, 22e, and 23e based on a selection signal from the drive circuit 30e, the piezoelectric motors 11e, 12e, and 13e are driven in a time-division manner, and the joints 314a, 315a, and 316a rotate.

Similarly, the piezoelectric motors 11f, 12f, and 13f and the relays 21f, 22f, and 23f are connected to the drive circuit 30f. By the switching of the relays 21f, 22f, and 23f based on a selection signal from the drive circuit 30f, the piezoelectric motors 11f, 12f, and 13f are driven in a time-division manner, and the joints 314b, 315b, and 316b rotate. As a result, it is possible to transform the arms 312a and 312b in a desired shape as if they were human arms.

As described above, in the configurations of the robot hand 300 and the robot 310 according to the fourth embodiment, the following advantages can be achieved. Here, a, b, c, and d added to the reference numerals will not be marked.

(1) Since each joint includes the same drive device as the drive device 100 according to the first embodiment, it is possible to reduce the number of drive circuits 30 and the number of lines in comparison with the number of piezoelectric motors 11, 12, and 13. Since a piezoelectric motor is used, it is possible to make a brake mechanism disposed for each motor unnecessary, compared with a case where an electromagnetic motor or a pulse motor is used. As a result, it is possible to achieve a decrease in size, weight, and cost of the robot hand 300 and the robot 310.

(2) Since the number of lines between the drive circuit 30 and the piezoelectric motors 11, 12, and 13 which are separated from each other can be reduced, the load based on the weight of the lines or the restraining force due to the bundle of lines when causing the fingers 302 and the arms 312 to move is suppressed. Accordingly, it is possible to allow the fingers 302 of the robot hand 300 and the arms 312 of the robot 310 to more easily and accurately move.

The above-mentioned embodiments are only an example of the invention, and can be modified and applied in various forms without departing from the scope of the invention. Modification examples will be described below.

Modification Example 1

For example, in the first embodiment, the encoder signals have been individually fed back to the drive circuit 30 from the encoders 51, 52, 53, and 54 disposed in the piezoelectric motors 11, 12, 13, and 14, respectively, but the invention is not limited to this configuration. Plural relays may also be disposed in the encoders and the encoders 51, 52, 53, and 54 may be switched by the relays. Alternatively, the encoders 51, 52, 53, and 54 may serialize and encode signals and feed back the resultant signals to the drive circuit 30, and the drive circuit 30 may parallelize and decode the signals. By employing this configuration, it is possible to reduce the number of lines between the drive circuit 30 and the encoders 51, 52, 53, and 54.

Modification Example 2

In the first embodiment, the digital amplifier 34 has been used in the drive circuit 30, but the invention is not limited to this configuration. For example, an analog amplifier may be used in the drive circuit 30. When an analog amplifier is used in the drive circuit 30, the PWM unit 33 and the inductor condensers 35 and 36 are unnecessary.

Modification Example 3

In the third embodiment, the positioning operation and the electrical characteristic inspecting operation are alternately performed by the use of the heads 80a and 80b and the heads 80c and 80d of the positioning mechanism 110, but the invention is not limited to this configuration. The positioning operation and the electrical characteristic inspecting operation may be performed together by the use of the heads 80a and 80b and the heads 80c and 80d. In this case, the positioning places P1 and P2 may be the same place, or the feed trays 241 and 242 and the recovery trays 251 and 252 may move in the Y direction.

Modification Example 4

In the third embodiment, the electronic component 70 in which the semiconductor chip 72 is mounted on the board 71 has been used as an example of the electronic component, but the electronic component is not limited to this configuration. A semiconductor chip, a display device such as an LCD, a crystal device, various sensors, an inkjet head, and the like may be used as the electronic component.

The entire disclosure of Japanese Patent Application No. 2011-266542, filed Dec. 6, 2011 is expressly incorporated by reference herein.

What is claimed is:

1. A drive device comprising:
a plurality of moving units that cause an object to move;
piezoelectric motors that cause the plurality of moving units to move;
drive circuits that drive the piezoelectric motors; and
switching units that electrically connect or disconnect the piezoelectric motors to or from the drive circuits,
wherein the number of the drive circuits is smaller than the number of the piezoelectric motors, and
each of the piezoelectric motors has a protrusion that is adapted to contact a driven member to move each of the plurality of moving units.

2. The drive device according to claim 1, wherein the number of the drive circuits is two or more.

3. The drive device according to claim 1, wherein moving directions of the moving units are different from each other.

4. The drive device according to claim 1, wherein the number of the switching units is two or more, and
wherein the switching units are disposed in the piezoelectric motors, respectively.

5. The drive device according to claim 1, wherein each of the switching units is formed of a photo-MOS relay.

6. A robot hand comprising:
The drive device according to claim 1.

7. A robot comprising:
The drive device according to claim 1.

8. An electronic component transporting apparatus comprising:
a plurality of grippers that grip an electronic component;
a moving unit that causes the plurality of grippers to move;
piezoelectric motors that cause the moving unit to move;
drive circuits that drive the piezoelectric motors; and
switching units that electrically connect or disconnect the piezoelectric motors to or from the drive circuits,
wherein the number of the drive circuits is smaller than the number of the piezoelectric motors, and
each of the piezoelectric motors has a protrusion that is adapted to contact a driven member to move the moving units.

9. The electronic component transporting apparatus according to claim 8, further comprising a linearly-moving mechanism that causes the moving unit to move forward and backward in a first direction,
wherein the plurality of piezoelectric motors include a first piezoelectric motor that causes the moving unit to move in the first direction and a second piezoelectric motor that causes the moving unit to move in a second direction different from the first direction, and
wherein the first piezoelectric motor is disposed to be closer to the moving unit than the second piezoelectric motor is with respect to the linearly-moving mechanism.

10. An electronic component inspecting apparatus that causes an electronic component to move to a predetermined position and to be disposed at the predetermined position and that electrically inspects the electronic component, comprising:
an inspection unit that inspects the electronic component;
a movable member that supports the electronic component and that is movable;
a plurality of piezoelectric motors that cause the movable member to move in a predetermined direction;
a single drive circuit that drives the plurality of piezoelectric motors; and
a plurality of switching elements that are disposed between the plurality of piezoelectric motors and the drive circuit and that electrically connect or disconnect at least one of the plurality of piezoelectric motors to or from the drive circuit, wherein
each of the plurality of piezoelectric motors has a protrusion that is adapted to contact a driven member to move the movable member.

11. The electronic component inspecting apparatus according to claim 10, further comprising a linearly-moving mechanism that causes the movable member to move forward and backward in a first direction,
wherein the plurality of piezoelectric motors include a first piezoelectric motor that causes the movable member to move in the first direction and a second piezoelectric motor that causes the movable member to move in a second direction different from the first direction, and
wherein the first piezoelectric motor is disposed to be closer to the movable member than the second piezoelectric motor is with respect to the linearly-moving mechanism.

* * * * *